(12) United States Patent
Koyama et al.

(10) Patent No.: US 12,520,424 B2
(45) Date of Patent: Jan. 6, 2026

(54) SEMICONDUCTOR STORAGE DEVICE

(71) Applicant: Kioxia Corporation, Tokyo (JP)

(72) Inventors: Chie Koyama, Fujisawa (JP); Kengo Kumagai, Yokohama (JP)

(73) Assignee: Kioxia Corporation, Tokyo (JP)

( * ) Notice: Subject to any disclaimer, the term of this patent is extended or adjusted under 35 U.S.C. 154(b) by 490 days.

(21) Appl. No.: 18/182,440

(22) Filed: Mar. 13, 2023

(65) Prior Publication Data

US 2024/0040700 A1 Feb. 1, 2024

(30) Foreign Application Priority Data

Jul. 26, 2022 (JP) ................. 2022-118740

(51) Int. Cl.
| | | |
|---|---|---|
| *H05K 1/11* | (2006.01) | |
| *H01L 23/48* | (2006.01) | |
| *H01L 23/488* | (2006.01) | |
| *H01L 23/498* | (2006.01) | |
| *H01L 23/538* | (2006.01) | |
| *H05K 1/18* | (2006.01) | |

(52) U.S. Cl.
CPC .............. *H05K 1/117* (2013.01); *H01L 23/48* (2013.01); *H01L 23/488* (2013.01); *H01L 23/498* (2013.01); *H01L 23/49816* (2013.01); *H01L 23/49838* (2013.01); *H01L 23/5386* (2013.01); *H05K 1/18* (2013.01); *H05K 2201/10022* (2013.01); *H05K 2201/10159* (2013.01)

(58) Field of Classification Search
CPC ...................... H05K 1/117; H05K 1/18; H05K 2201/10022; H05K 2201/10159; H01L 23/48; H01L 34/488; H01L 23/498; H01L 23/49816; H01L 23/49838; H01L 23/3586
USPC ......................................... 365/201
See application file for complete search history.

(56) References Cited

U.S. PATENT DOCUMENTS

| | | |
|---|---|---|
| 7,573,282 B2 | 8/2009 | Sylvester |
| 9,383,401 B2 | 7/2016 | Omori et al. |
| 11,127,713 B2 | 9/2021 | Kwon et al. |
| 2015/0116968 A1* | 4/2015 | Yamada ............ H01L 23/49894 361/767 |
| 2020/0365225 A1* | 11/2020 | Na .......................... G11C 29/38 |

(Continued)

*Primary Examiner* — Ly D Pham
(74) *Attorney, Agent, or Firm* — Oblon, McClelland, Maier & Neustadt, L.L.P.

(57) ABSTRACT

A semiconductor storage device according to an embodiment includes a board, a first semiconductor memory, a second semiconductor memory, a controller, and a wiring. The first semiconductor memory includes a first bonding member. The first semiconductor memory has a first corner, a second corner, a third corner, and a fourth corner. The second semiconductor memory includes a second bonding member. The second semiconductor memory has a fifth corner, a sixth corner, a seventh corner, and an eighth corner. The first bonding member is a first detection-bonding member. The first detection-bonding member detects a connection state of the first semiconductor memory and the second semiconductor memory. The second bonding member is a second detection-bonding member. The second detection-bonding member is electrically connected to the first detection-bonding member. The second detection-bonding member detects a connection state of the first semiconductor memory and the second semiconductor memory.

12 Claims, 23 Drawing Sheets

(56) References Cited

U.S. PATENT DOCUMENTS

2021/0066143 A1* 3/2021 Jung .................... H01L 24/95
2022/0052015 A1* 2/2022 Hasegawa ........... H01L 25/0657

* cited by examiner

SEMICONDUCTOR STORAGE DEVICE

CROSS-REFERENCE TO RELATED APPLICATION

This application is based upon and claims the benefit of priority from Japanese Patent Application No. 2022-118740, filed Jul. 26, 2022; the entire contents of which are incorporated herein by reference.

FIELD

Embodiments described herein relate generally to a semiconductor storage device.

BACKGROUND ART

A semiconductor storage device including a board and a semiconductor memory mounted on the board is known. The semiconductor memory includes a plurality of bonding members bonded to the board.

DETAILED DESCRIPTION

Figure 1:
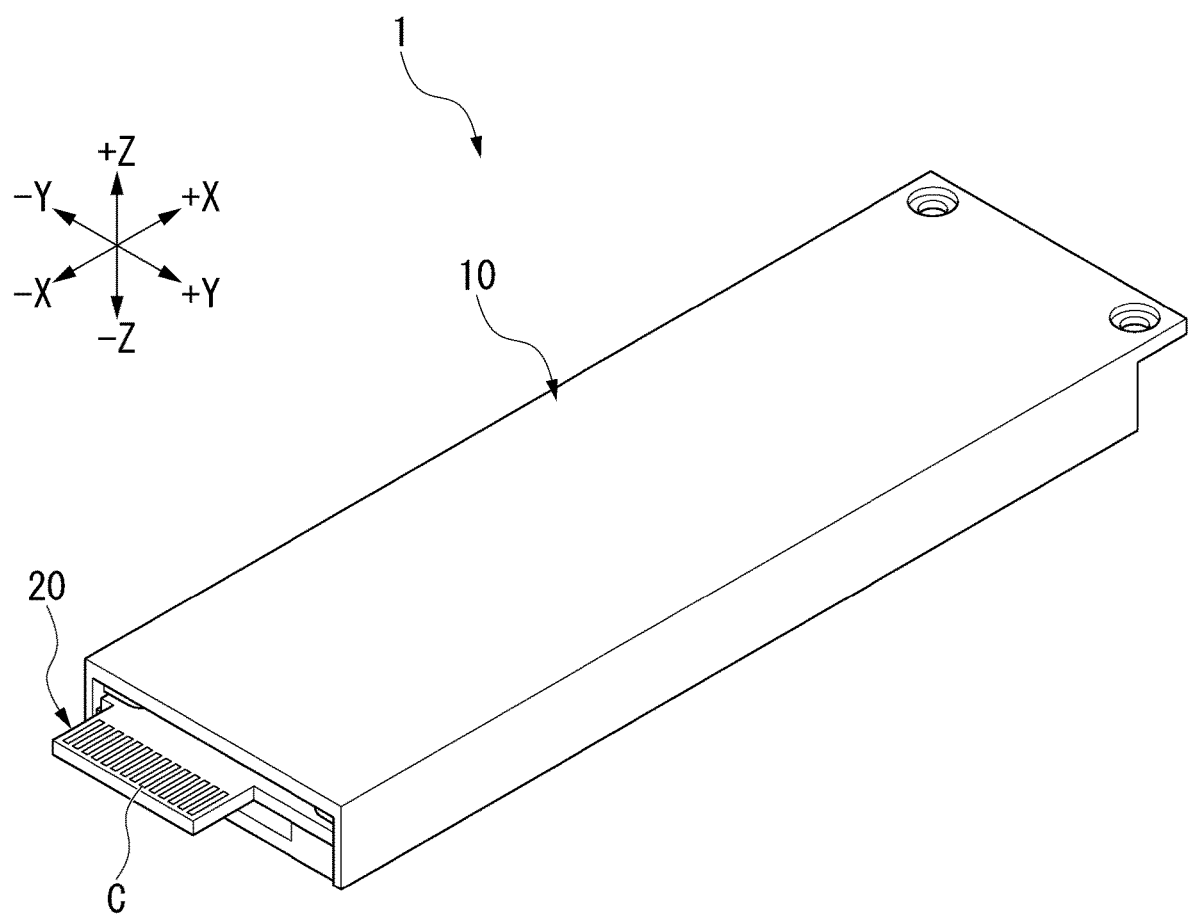
FIG. 1 is a perspective view showing a semiconductor storage device according to a first embodiment.

A semiconductor storage device according to an embodiment includes a board, a first semiconductor memory, a second semiconductor memory, a controller, and a wiring. The first semiconductor memory includes a plurality of first bonding members bonded to the board. The first semiconductor memory has a first corner, a second corner, a third corner, and a fourth corner when viewed from a first direction serving as a thickness direction of the board. The second semiconductor memory includes a plurality of second bonding members bonded to the board. The second semiconductor memory has a fifth corner, a sixth corner, a seventh corner, and an eighth corner when viewed from the first direction. At least one of the plurality of the first bonding members is a first detection-bonding member. The first detection-bonding member is configured to detect a connection state associated with the first semiconductor memory and the second semiconductor memory. At least one of the plurality of the second bonding members is a second detection-bonding member. The second detection-bonding member is electrically connected to the first detection-bonding member. The second detection-bonding member is configured to detect a connection state associated with the first semiconductor memory and the second semiconductor memory. Each of the first detection-bonding member and the second detection-bonding member is configured to be electrically connected to the controller, a power supply terminal, and a ground terminal, via the wiring. The power supply terminal is configured to supply a power supply voltage to the semiconductor storage device. The ground terminal is configured to supply ground potential to the semiconductor storage device. The controller is configured to detect a voltage of the wiring. The plurality of the first bonding members include a first group and a second group. The first group includes one part of the plurality of the first bonding members. The second group includes the other part of the plurality of the first bonding members. The second group is at a position closer to the first corner than the first group. The second group includes the first detection-bonding member. The plurality of the second bonding members include a third group and a fourth group. The third group includes one part of the plurality of the second bonding members. The fourth group includes the other part of the plurality of the second bonding members. The fourth group is at a position closer to the fifth corner than the third group. The fourth group includes the second detection-bonding member. The fifth corner is closer to the first corner than the sixth corner, the seventh corner, and the eighth corner. The first corner is closer to the fifth corner than the second corner, the third corner, and the fourth corner.

Hereinafter, a semiconductor storage device of embodiments will be described with reference to the drawings. In the following description, configurations having the same or similar functions will be designated by the same reference signs. Duplicate descriptions of such configurations may be omitted. In the present application, "parallel", "orthogonal", or "the same" each may include "substantially parallel", "substantially orthogonal", or "substantially the same", respectively. In the present application, "connection" is not limited to mechanical coupling and may include electrical coupling. Furthermore, "connection" is not limited to a case in which two members to be connected are directly connected to each other, but may also include a case in which two members to be connected are connected to each other with another member interposed therebetween. In the present application, "overlap" includes a case in which two members overlap each other with another member interposed therebetween.

Here, a +X direction, a −X direction, a +Y direction, a −Y direction, a +Z direction, and a −Z direction will be defined. Each of the +X direction, the −X direction, the +Y direction, and the −Y direction is a direction parallel to a first surface 21$a$ of a board 21 described below (refer to FIG. 2). The +X direction is a direction from a first end portion 21$e$1 toward a second end portion 21$e$2 of the board 21 (refer to FIG. 2). The −X direction is a direction opposite to the +X direction. The +X direction and the −X direction will be simply referred to as an "X direction" unless otherwise distinguished. Each of the +Y direction and the −Y direction is a direction crossing the X direction (for example, orthogonal to the X direction). The +Y direction is a direction from a NAND memory 25A toward a NAND memory 25B described below (refer to FIG. 2). The −Y direction is a direction opposite to the +Y direction. The +Y direction and the −Y direction will be simply referred to as a "Y direction" unless otherwise distinguished. Each of the +Z direction and the −Z direction is a direction crossing the X direction and the Y direction (for example, orthogonal to the X direction) and is a thickness direction of the board 21. The thickness direction of the board 21 corresponds to a first direction. The +Z direction is a direction from a second surface 21$b$ of the board 21 toward the first surface 21$a$ (refer to FIG. 2). The −Z direction is a direction opposite to the +Z direction. The +Z direction and the −Z direction will be simply referred to as a "Z direction" unless otherwise distinguished.

First Embodiment

<1. Overall Configuration of Semiconductor Storage Device>

A semiconductor storage device 1 of a first embodiment will be described with reference to FIGS. 1 to 7.

FIG. 1 is a perspective view showing the semiconductor storage device 1. For example, the semiconductor storage device 1 is a storage device such as a solid-state drive (SSD). For example, the semiconductor storage device 1 is configured to be attached to an information-processing apparatus (hereinafter, referred to as a host device) such as a server or a personal computer and used as a storage for the host device.

Figure 2:
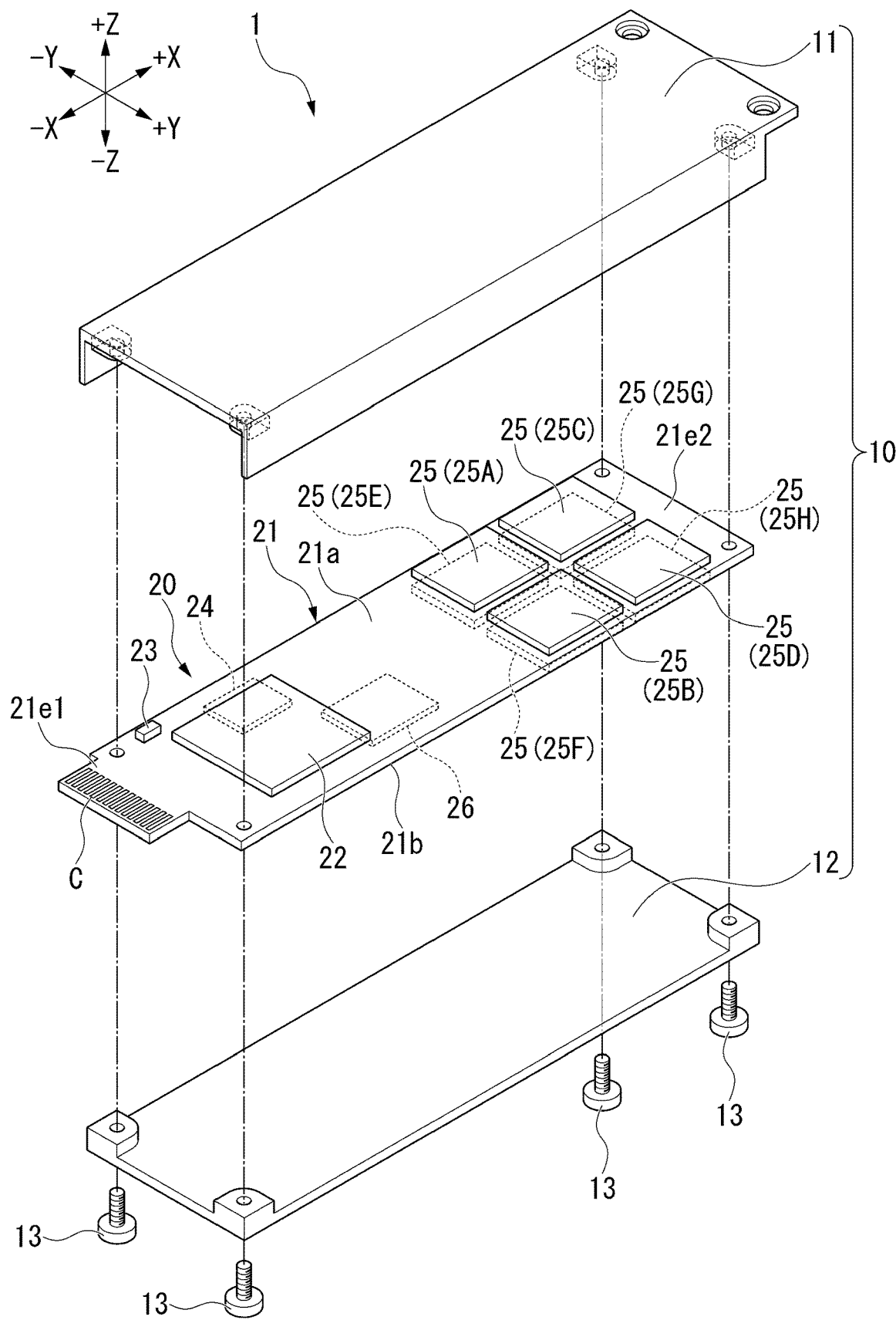
FIG. 2 is a partially exploded perspective view showing the semiconductor storage device according to the first embodiment.

FIG. 2 is a partially exploded perspective view showing the semiconductor storage device 1. The semiconductor storage device 1 includes, for example, a housing 10 and a board unit 20.

<1.1 Housing>

The housing 10 is a member forming an external shape of the semiconductor storage device 1 (refer to FIG. 1). The shape of the housing 10 is, for example, a flat rectangular tube. As shown in FIG. 2, the housing 10 includes, for example, a first member 11, a second member 12, and a plurality of fixing members 13. The first member 11 has, for example, a first wall portion, a second wall portion, and a third wall portion. The first wall portion is located on a side in the +Z direction with respect to the board unit 20. The second wall portion is located on a side in the +Y direction with respect to the board unit 20. The third wall portion is located on a side in the −Y direction with respect to the board unit 20. The second member 12 has a fourth wall portion located on a side in the −Z direction with respect to the board unit 20. The fixing member 13 is a member configured to couple the first member 11 and the second member 12. The fixing member 13 is, for example, a screw. In the embodiment, the first member 11 is coupled to the second member 12 by the plurality of the fixing members 13, and therefore the housing 10 is formed.

<1.2 Board Unit>

The board unit 20 is an assembly on which devices or components including circuits are mounted. At least a part of the board unit 20 is accommodated in the housing 10. The board unit 20 includes, for example, the board 21, a controller 22, a power conversion component 23, a power supply circuit component 24, a plurality of NAND memories 25 (NAND memories 25A to 25H), and a DRAM 26 (Dynamic Random Access Memory).

The board 21 is a printed-wiring board. The board 21 has a first surface side and a second surface side opposite to the first surface side. The board 21 has a plate shape along the X direction and the Y direction. The board 21 has the first surface 21$a$ and the second surface 21$b$. The first surface 21$a$ is a surface facing in the +Z direction. The second surface 21$b$ is located on the opposite side of the first surface 21$a$. The second surface 21$b$ is a surface facing in the −Z direction.

The board 21 has both end portions in a longitudinal direction of the board 21. That is, the board 21 has the first end portion 21$e$1 and the second end portion 21$e$2 on the opposite side of the first end portion 21$e$1. The first end portion 21$e$1 of the board 21 has a connector C. The connector C is an electrical connection portion configured to be connected to the host device. The connector C includes a power supply terminal and a ground terminal. The power supply terminal is used to supply a power supply voltage to the semiconductor storage device 1. The ground terminal is used to supply ground potential to the semiconductor storage device 1.

Figure 4:
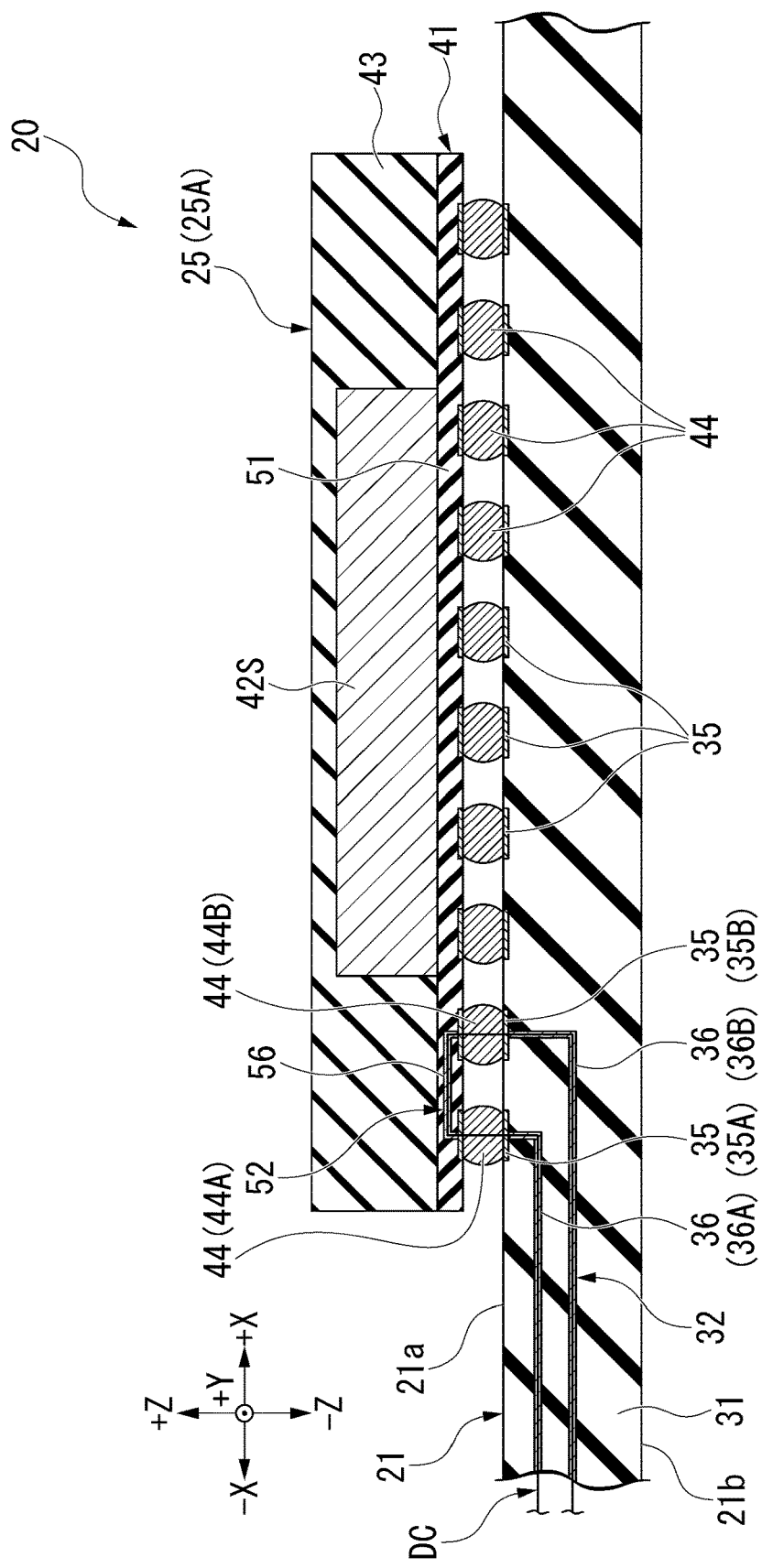
FIG. 4 is a cross-sectional view explaining a part of a daisy chain according to the first embodiment.

The board 21 includes an insulating base member 31 and a wiring pattern 32 provided in the insulating base member 31 (refer to FIG. 4). The wiring pattern 32 has a plurality of pads 35 and a plurality of conductive lines 36. The plurality of the pads 35 are connected to the NAND memories 25. The wiring pattern 32 is an example of a "wiring". The plurality of the conductive lines 36 is an example of a "wiring".

The controller 22 is a control component (control device) mounted on the board 21. The controller 22 is configured to detect a voltage of a wiring. The controller 22 is configured to generally control the entire semiconductor storage device 1. The controller 22 is, for example, a semiconductor package including a SoC (System on a Chip). In the SoC, for example, a host interface circuit, control circuits, or the like are integrated into one semiconductor chip. The host interface circuit is configured to carry out communication with the host device. The control circuits are configured to control the plurality of the NAND memories 25 and the DRAM 26. The controller 22 is configured to control writing of data, reading of data, or erasing of data with respect to the plurality of the NAND memories 25.

The power conversion component 23 is component configured to carry out conversion of electric power. The power conversion component 23 is, for example, a DC-DC converter. The power conversion component 23 is configured to convert electric power supplied from the host device via the connector C into a desired power. The power conversion component 23 is configured to output the converted power to the power supply circuit component 24.

The power supply circuit component 24 is a component configured to carry out power control. The power supply circuit component 24 is, for example, a PMIC (Power Management IC). The power supply circuit component 24 is configured to supply power to various components (devices) included in the board unit 20, for example, the controller 22, the NAND memories 25, the DRAM 26, or the like.

Each of the NAND memories 25 is a semiconductor package including a nonvolatile semiconductor memory chip configured to store data. Each of the NAND memories 25 is, for example, a NAND flash memory. As shown in FIG. 2, the plurality of the NAND memories 25 are separately mounted on the first surface 21a and the second surface 21b of the board 21. The NAND memory 25 is an example of a "semiconductor memory". However, the "semiconductor memory" may be a NOR flash memory, a magnetoresistive random access memory (MRAM), a resistive random access memory (ReRAM), or the like.

The plurality of the NAND memories 25 are disposed on a side in the +X direction with respect to the controller 22. The plurality of the NAND memories 25 include: a plurality of (for example, four) NAND memories 25A to 25D mounted on the first surface 21a of the board 21; and a plurality of (for example, four) NAND memories 25E to 25H mounted on the second surface 21b of the board 21. The NAND memories 25A and 25B are disposed on a side in the −X direction with respect to the NAND memories 25C and 25D. The NAND memories 25A and 25B are adjacent to each other in the Y direction. The NAND memories 25C and 25D are adjacent to each other in the Y direction. Similarly, the NAND memories 25E and 25F are disposed on the side in the −X direction with respect to the NAND memories 25G and 25H. The NAND memories 25E and 25F are adjacent to each other in the Y direction. The NAND memories 25G and 25H are adjacent to each other in the Y direction. Hereinbelow, the NAND memories 25A to 25H will be simply referred to as a "NAND memory 25" unless otherwise distinguished from each other.

The DRAM 26 is a semiconductor package including a volatile semiconductor memory chip configured to store data. The DRAM 26 may be used as a data buffer. The data buffer is configured to temporarily store write data received from the host device, read data read out from one or more NAND memories 25, or the like.

<2. NAND Memory>
<2.1 Configuration of NAND Memory>

Next, a configuration of the NAND memory 25 will be described.

Figure 3:
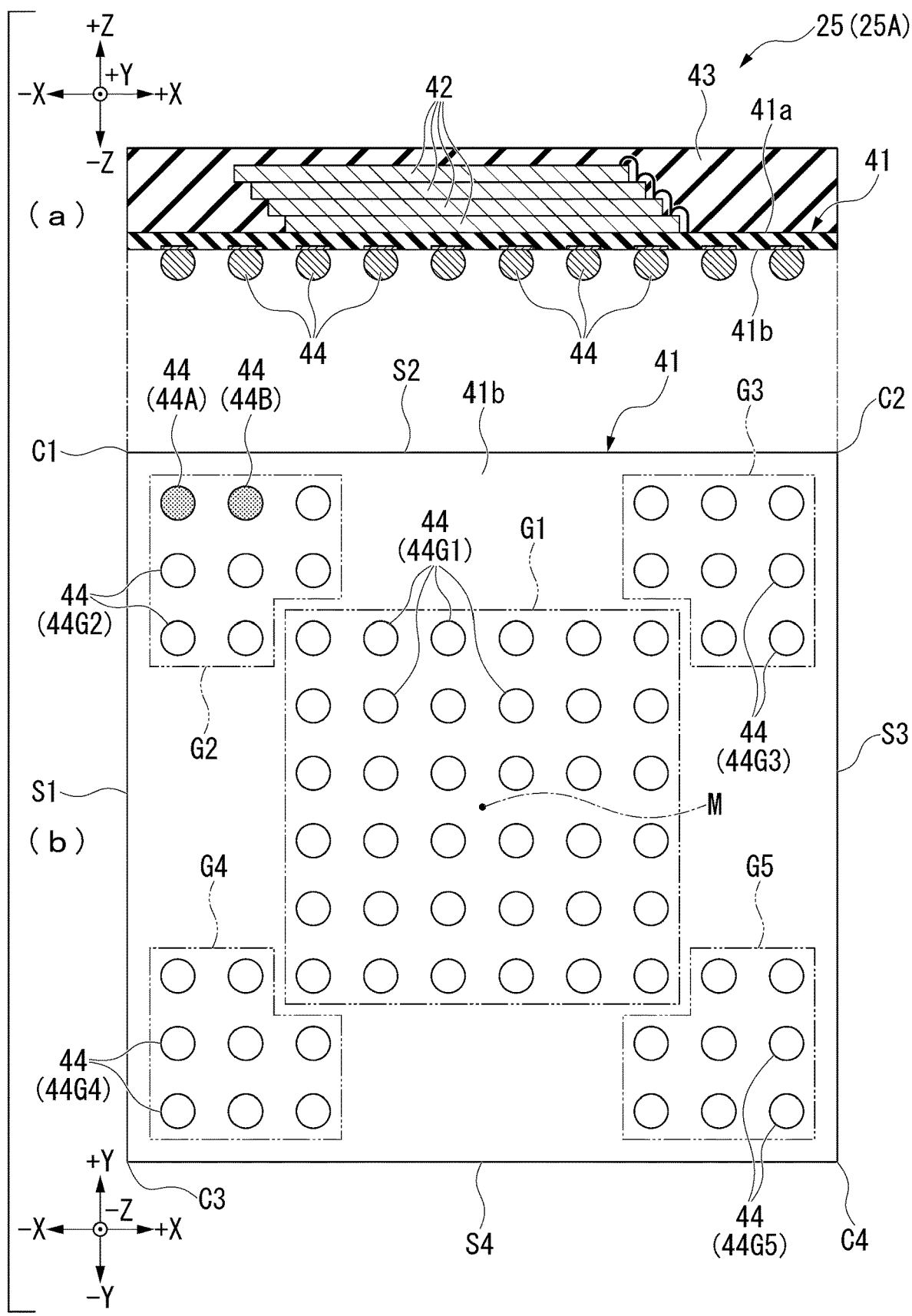
FIG. 3 is a view explaining a configuration of the semiconductor memory according to the first embodiment.

FIG. 3 is a view explaining a configuration of the NAND memory 25. PART (a) of FIG. 3 is a cross-sectional view showing the NAND memory 25. PART (b) of FIG. 3 is a bottom view showing the NAND memory 25. The ends of the NAND memory 25 in the −X direction and the +X direction shown in PART (a) of FIG. 3 coincide with the ends of the NAND memory 25 in the −X direction and the +X direction shown in PART (b) of FIG. 3. The NAND memory 25 includes: a package substrate 41, one or more semiconductor memories chips 42, a sealing resin part 43, and a plurality of bonding members 44. Note that, the NAND memory 25 is formed in, for example, a rectangular shape shown in FIG. 2. However, the NAND memory 25 having a square shape is shown in FIG. 3 and several drawings for convenience of explanation.

The package substrate 41 is a base substrate of the NAND memory 25. The package substrate 41 is a printed-wiring board. The package substrate 41 has a plate shape along the X direction and the Y direction. The package substrate 41 has a first surface 41a and second surface 41b. The second surface 41b is located on the opposite side of the first surface 41a. When viewed from the Z direction, the package substrate 41 determines an outer shape of the NAND memory 25. The package substrate 41 includes an insulating base member 51 and a wiring pattern 52 (refer to FIG. 4). The wiring pattern 52 is provided in the insulating base member 51.

Each of one or more semiconductor memory chips 42 includes a plurality of memory cells. The semiconductor memory chip 42 is a component configured to store data. One or more semiconductor memory chips 42 are multi-layered on the first surface 41a of the package substrate 41 in the Z direction. Each of one or more semiconductor memory chips 42 has a plate shape along the X direction and the Y direction. Accordingly, a structure having one or more semiconductor memory chips 42 which are multi-layered on the package substrate 41 is obtained. Hereinbelow, the structure may be schematically shown in the drawings and may be referred to as a "memory-chip structure 42S" (refer to FIG. 4).

The sealing resin part 43 is a sealing part that covers one or more semiconductor memory chips 42. The sealing resin part 43 is a so-called molded resin part. The sealing resin part 43 has insulation property.

Each of the plurality of the bonding members 44 is an electrical connection terminal. The bonding members 44 are exposed to the outside of the NAND memory 25. The plurality of the bonding members 44 are provided on the second surface 41b of the package substrate 41. The plurality of the bonding members 44 are arranged side by side in the X direction and the Y direction. Each bonding member 44 is connected to the pad 35 of the board 21. In the embodiment, each of the plurality of the bonding members 44 is a solder ball. That is, in the embodiment, the NAND memory 25 is a BGA (Ball Grid Array) semiconductor package. However, the bonding member 44 is not limited to the solder ball. The bonding member 44 may be a pad or the like configured to be connected to the board 21 via conductive paste.

<2.2 Arrangement of Bonding Members>

Next, an arrangement of the bonding members 44 will be described.

Here, firstly, a shape of the NAND memory 25 will be described. As shown in PART (b) of FIG. 3, when viewed from the Z direction, the NAND memory 25 (for example, the package substrate 41) is formed in a rectangular shape, and the NAND memory 25 has four sides S1 to S4, and four corners C1 to C4. The sides S1 to S4 correspond to a first side S1, a second side S2, a third side S3, and a fourth side S4, respectively. The corners C1 to C4 correspond to a first corner C1, a second corner C2, a third corner C3, and a fourth corner C4, respectively.

The side S1 is located at, for example, an end of the NAND memory 25 on the side in the −X direction. The side S1 extends in the Y direction. The side S2 is located at, for example, an end of the NAND memory 25 on the side in the +Y direction. The side S2 extends in the X direction. The side S3 is located at, for example, an end of the NAND memory 25 on the side in the +X direction. The side S3 extends in the Y direction. The side S4 is located at, for example, an end of the NAND memory 25 on the side in the −Y direction. The side S4 extends in the X direction.

The corner C1 is an intersection point of the side S1 and the side S2. The corner C2 is an intersection point of the side S2 and the side S3. The corner C3 is an intersection point of the side S1 and the side S4. The corner C4 is an intersection point of the side S3 and the side S4.

Next, the arrangement of the plurality of the bonding members 44 will be described. The plurality of the bonding members 44 are separated into, for example, a first bonding group G1 to a fifth bonding group G5. Specifically, the plurality of the bonding members 44 include, for example, a plurality of bonding members 44G1 included in the first bonding group G1, a plurality of bonding members 44G2 included in the second bonding group G2, a plurality of bonding members 44G3 included in the third bonding group G3, a plurality of bonding members 44G4 included in the fourth bonding group G4, and a plurality of bonding members 44G5 included in the fifth bonding group G5.

The plurality of the bonding members 44G1 included in the first bonding group G1 are disposed so as to correspond to a medial region of the NAND memory 25. In other words, the plurality of the bonding members 44G1 are provided on the medial region of the NAND memory 25. The medial region of the first bonding group G1 is defined by a chain double-dashed line. The medial region of the NAND memory 25 has a center M of the NAND memory 25. The plurality of the bonding members 44G1 are arrayed in the X direction and the Y direction in a grid pattern with respect to the center M.

The plurality of the bonding members 44G2 included in the second bonding group G2 are arranged closer to the corner C1 than the center M of the NAND memory 25. The plurality of the bonding members 44G2 are arranged along the side S1 or the side S2 of the NAND memory 25. The plurality of the bonding members 44G2 include: the bonding members 44 forming a plurality of rows disposed on the side in the −X direction; and the bonding members 44 forming a plurality of rows disposed on the side in the +Y direction. The bonding members 44 on the plurality of the rows disposed on the side in the −X direction are far from the plurality of the bonding members 44G1 included in the first bonding group G1 in the −X direction. The bonding members 44 on the plurality of the rows disposed on the side in the +Y direction are far from the plurality of the bonding members 44G1 included in the first bonding group G1 in the +Y direction.

The plurality of the bonding members 44G3 included in the third bonding group G3 are arranged closer to the corner C2 than the center M of the NAND memory 25. The plurality of the bonding members 44G3 are arranged along the side S2 or the side S3 of the NAND memory 25. The plurality of the bonding members 44G3 include: the bonding members 44 forming a plurality of rows disposed on the side in the +X direction; and the bonding members 44 forming a plurality of rows disposed on the side in the +Y direction. The bonding members 44 on the plurality of the rows disposed on the side in the +X direction are far from the plurality of the bonding members 44G1 included in the first bonding group G1 in the +X direction. The bonding members 44 on the plurality of the rows disposed on the side in the +Y direction are far from the plurality of the bonding members 44G1 included in the first bonding group G1 in the +Y direction.

The plurality of the bonding members 44G4 included in the fourth bonding group G4 are arranged closer to the corner C3 than the center M of the NAND memory 25. The plurality of the bonding members 44G4 are arranged along the side S1 or the side S4 of the NAND memory 25. The plurality of the bonding members 44G4 include: the bonding members 44 forming a plurality of rows disposed on the side in the −X direction; and the bonding members 44 forming a plurality of rows disposed on the side in the −Y direction. The bonding members 44 on the plurality of the rows disposed on the side in the −X direction are far from the plurality of the bonding members 44G1 included in the first bonding group G1 in the −X direction. The bonding members 44 on the plurality of the rows disposed on the side in the −Y direction are far from the plurality of the bonding members 44G1 included in the first bonding group G1 in the −Y direction.

The plurality of the bonding members 44G5 included in the fifth bonding group G5 are arranged closer to the corner C4 than the center M of the NAND memory 25. The plurality of the bonding members 44G5 are arranged along the side S3 or the side S4 of the NAND memory 25. The plurality of the bonding members 44G5 include: the bonding members 44 forming a plurality of rows disposed on the side in the +X direction; and the bonding members 44 forming a plurality of rows disposed on the side in the −Y direction. The bonding members 44 on the plurality of the rows disposed on the side in the +X direction are far from the plurality of the bonding members 44G1 included in the first bonding group G1 in the +X direction. The bonding members 44 on the plurality of the rows disposed on the side in the −Y direction are far from the plurality of the bonding members 44G1 included in the first bonding group G1 in the −Y direction.

In the embodiment, the plurality of the bonding members 44G1 included in the first bonding group G1 include a signal terminal, a power supply terminal, a ground terminal, or the like. A signal flows into the signal terminal. Electric power is supplied to the power supply terminal from the power supply circuit component 24. The ground terminal is connected to ground GND. The ground GND has a potential serving a reference potential for operating the controller 22 and the NAND memory 25. In the embodiment, a terminal of each of the bonding members 44G1 is used for operations of the NAND memory 25 such as writing operation, reading operation, or erasing operation. On the other hand, each of the plurality of the bonding members 44G2, 44G3, 44G4, and 44G5 included in the second bonding group G2 to the fifth bonding group G5 is a so-called dummy terminal. The bonding members 44G2, 44G3, 44G4, and 44G5 are not used for operation of the NAND memory 25.

<3. Connection Relationship of Daisy Chain>

Next, a daisy chain DC provided in the semiconductor storage device 1 will be described. In the present application, "daisy chain" means an electrical connection part. The electrical connection part connects three or more electro-conductive elements in series. For example, the daisy chain is an electrical connection part configured to detect a connection state between the board 21 and the NAND memory 25 (or a product life).

<3.1 Configuration of Daisy Chain>

FIG. 4 is a cross-sectional view explaining a part of the daisy chain DC. The daisy chain DC includes, for example, two conductive lines 36A and 36B, two pads 35A and 35B, one or more bonding members 44A and 44B (hereinbelow, referred to as "detection-bonding members 44A and 44B"), and a conductive line 56. The conductive line 36A is an example of a "first wiring". The conductive line 36B is an example of a "second wiring". The two conductive lines 36A and 36B are included in the plurality of the conductive lines 36 provided in the board 21. The two pads 35A and 35B are included in the plurality of the pads 35 provided on the board 21. The detection-bonding members 44A and 44B correspond to one or more bonding members 44 (for example, two bonding members) included in the plurality of the bonding members 44 of the NAND memory 25 as described above. The conductive line 56 is included in the wiring pattern 52 provided in the package substrate 41.

The conductive line 36A is connected to the pad 35A. The detection-bonding member 44A of the NAND memory 25 is bonded to the pad 35A. On the other hand, the conductive line 36B is connected to the pad 35B. The detection-bonding member 44B of the NAND memory 25 is bonded to the pad 35B. The conductive line 56 connects the detection-bonding member 44A and the detection-bonding member 44B in the NAND memory 25.

With the configuration described above, the conductive line 36A is connected to the detection-bonding member 44A of the NAND memory 25 via the pad 35A. On the other hand, the conductive line 36B is connected to the detection-bonding member 44B of the NAND memory 25 via the pad 35B. In other words, the plurality of the detection-bonding members 44A and 44B are electrically connected in series between the conductive line 36A and the conductive line 36B. Consequently, it is possible to detect a connection state between the board 21 and the bonding members 44 (for example, the detection-bonding members 44A and 44B) by detecting the characteristic value (for example, voltage value) variation depending on the resistance value between the conductive line 36A and the conductive line 36B.

In other cases, the conductive lines 36A and 36B may be provided in an inner layer of the board 21 or may be provided on a surface layer of the board 21. Similarly, the conductive line 56 may be provided in an inner layer of the package substrate 41 or may be provided on a surface layer of the package substrate 41.

<3.2 Arrangement of Bonding Members Included in Daisy Chain>

Next, an arrangement of the detection-bonding members 44A and 44B included in the daisy chain DC will be described. In the embodiment, the plurality of the detection-bonding members 44A and 44B are disposed so as to correspond to one corner of the four corners C1 to C4 of the NAND memory 25. In other words, "one corner of the four corners C1 to C4" may be referred to as "a corner optionally selected from the four corners C1 to C4" or "optionally selected corner of the four corners C1 to C4". In other words, the plurality of the detection-bonding members 44A and 44B are disposed are closer to the first corner C1 than each of the second corner C2, the third corner C3, and the fourth corner C4. The detection-bonding members 44A and 44B are configured to detect a connection state associated with the NAND memory 25. In this case, the detection-bonding member 44A may be referred to as a "first detection-bonding member" or a "first detection-bonding portion". Furthermore, the detection-bonding member 44B may be referred to as a "second detection-bonding member" or a "second detection-bonding portion". The detection-bonding member 44A is configured to be electrically connected to the controller 22, a power supply terminal, and a ground terminal, via the first wiring. The power supply terminal is configured to supply a power supply voltage used to operate the semiconductor storage device. The ground terminal is configured to supply ground potential to the semiconductor storage device. The detection-bonding member 44B is configured to be electrically connected to the power supply terminal via the second wiring. The controller 22 is configured to detect a voltage of the first wiring in a case in which the first wiring is connected to the controller 22 and the ground terminal. In this structure, the NAND memory 25 may include a conductive line. The conductive line electrically connects the detection-bonding member 44A and the detection-bonding member 44B. In the present application, for example, "the detection-bonding members 44A and 44B are disposed so as to correspond to one corner" means that the detection-bonding members 44A and 44B are included in the bonding group closest to the optionally selected corner, of the second bonding group G2 to the fifth bonding group G5 mentioned above. For example, FIG. 3 shows that the detection-bonding members 44A and 44B are disposed so as to correspond to the corner C1. In this case, the detection-bonding members 44A and 44B are included in the second bonding group G2. Note that, seen from another point of view, "disposed so as to correspond to one corner" or "disposed so as to correspond to the optionally selected corner" means that the detection-bonding members 44A and 44B are included in, for example, a grid array. Specifically, regarding the array of bonding members 44, the NAND memory 25 includes a grid array defined by: a plurality of rows closest to the optionally selected corner (i.e., one corner of the four corners C1 to C4) such as three or less rows extending along the X direction; and a plurality of rows closest to the optionally selected corner such as three or less rows extending along the Y direction. In other words, the NAND memory 25 includes a three-by-three grid array.

In the embodiment, one of the aforementioned two detection-bonding members 44A and 44B, that is, the detection-bonding member 44A, is the bonding member 44 closest to the optionally selected corner, of the plurality of the bonding members 44 of the NAND memory 25. In other words, the detection-bonding member 44A is a so-called corner bump. On the other hand, the other of the aforementioned two detection-bonding members 44A and 44B, that is, the detection-bonding member 44B, is the bonding member 44 adjacent to the detection-bonding member 44A along one side of the NAND memory 25. That is, the detection-bonding member 44B is one bonding member 44 of the plurality of the bonding members 44 disposed at an outermost peripheral region of the NAND memory 25. The outermost peripheral region is on the second surface 41b. The outermost peripheral region is a region closest to the ends of the NAND memory 25 in the X direction or the Y direction. The outermost peripheral region is a region closest to the four sides of the NAND memory 25. The outermost peripheral region is an array of the bonding members 44 on the second surface 41b.

Figure 5:
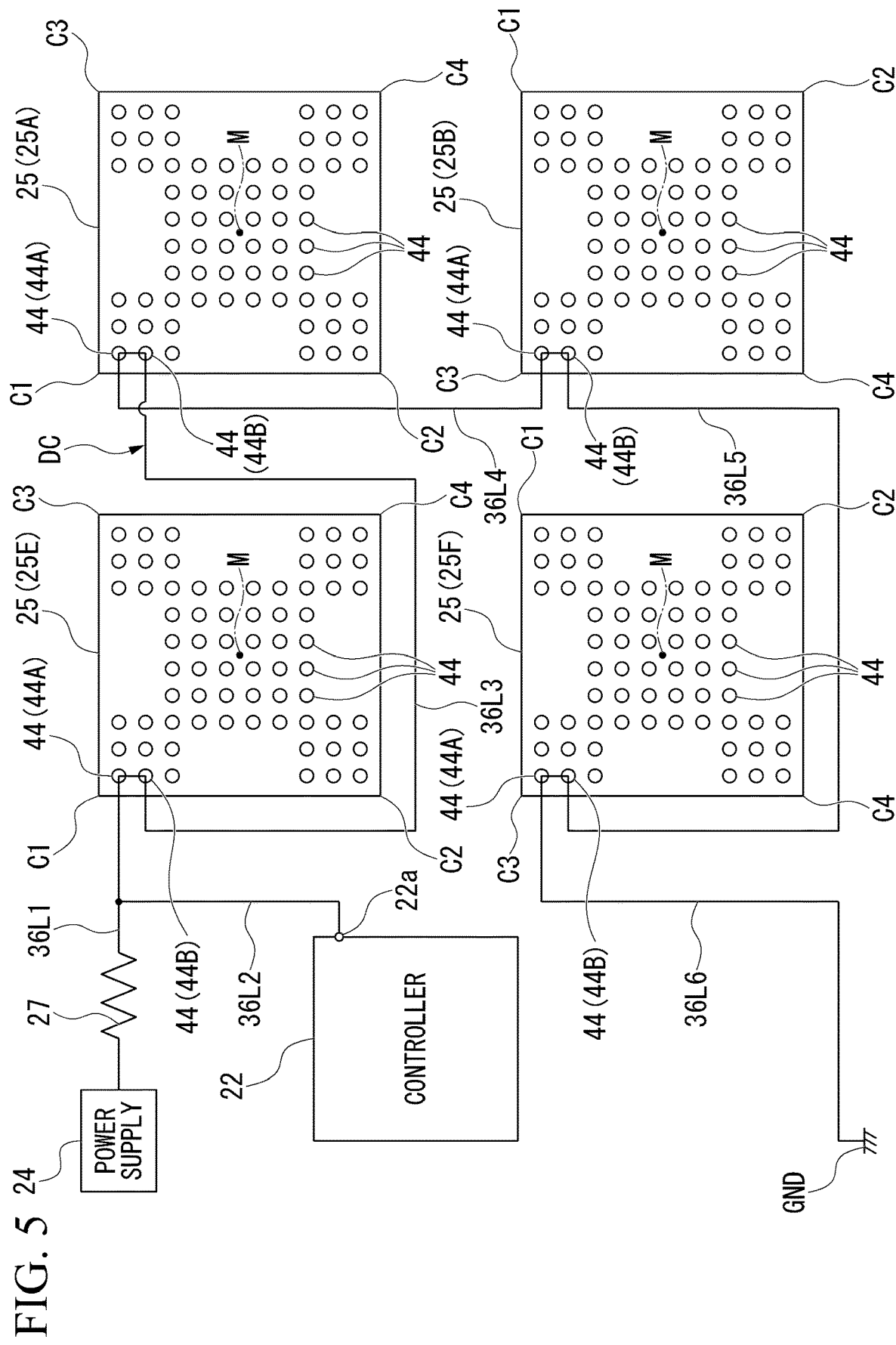
FIG. 5 is a view explaining a connection relationship of the daisy chain according to the first embodiment.

FIG. 5 is a view explaining a connection relationship of the daisy chain DC. In the embodiment, the daisy chain DC is provided throughout, for example, the board 21 and the four NAND memories 25A, 25B, 25E, and 25F. The daisy chain DC is a daisy chain associated with the four NAND memories 25A, 25B, 25E, and 25F. In the embodiment, for a daisy chain associated with the four NAND memories 25A, 25B, 25E, and 25F, the daisy chain DC is only provided to the four NAND memories 25A, 25B, 25E, and 25F.

In the embodiment, the daisy chain DC includes: conductive lines 36L1 to 36L6 included in the plurality of the conductive lines 36 of the board 21; the detection-bonding members 44A and 44B included in each of the four NAND memories 25A, 25B, 25E, and 25F; and the conductive line 56 included in each of the four NAND memories 25A, 25B, 25E, and 25F. Each of the conductive lines 36L1 to 36L6 functions as at least one of the conductive line 36A and the conductive line 36B described above.

One end of the conductive line 36L1 is connected to the power supply circuit component 24 (power supply) via a resistance element 27. The power supply circuit component 24 is configured to apply a voltage to the conductive line 36L1. The other end of the conductive line 36L1 is connected to the detection-bonding member 44A of the NAND memory 25E. One end of the conductive line 36L2 is connected to the middle of the conductive line 36L1. The other end of the conductive line 36L2 is connected to an input terminal 22a (detection terminal) of the controller 22. The controller 22 is configured to detect a voltage value applied from the conductive line 36L2 to the input terminal 22a.

One end of the conductive line 36L3 is connected to the detection-bonding member 44B of the NAND memory 25E. The other end of the conductive line 36L3 is connected to the detection-bonding member 44B of the NAND memory 25A. One end of the conductive line 36L4 is connected to the detection-bonding member 44A of the NAND memory 25A. The other end of the conductive line 36L4 is connected to the detection-bonding member 44A of the NAND memory 25B. One end of the conductive line 36L5 is connected to the detection-bonding member 44B of the NAND memory 25B. The other end of the conductive line 36L5 is connected to the detection-bonding member 44B of the NAND memory 25F. One end of the conductive line 36L6 is connected to the detection-bonding member 44A of the NAND memory 25F. The other end of the conductive line 36L6 is connected to the ground GND. In other words, the detection-bonding member 44A serving as the first detection-bonding member is electrically connected between one end of the conductive line 36L3 and the conductive line 36L4. The detection-bonding member 44B serving as the second detection-bonding member is electrically connected to the other end of the conductive line 36L3.

With this configuration, in a case in which a connection state of the four NAND memories 25A, 25B, 25E, and 25F and the board 21 is a normal state, a low voltage value less than a predetermined standard (for example, 0V) is input to the input terminal 22a of the controller 22. On the other hand, in a case in which the connection state is an abnormal state such that a connection state between the board 21 and at least one of the detection-bonding members 44A and 44B included in the four NAND memories 25A, 25B, 25E, and 25F has a defect (for example, fracture or peeling occurs in the bonding member), a high voltage value higher than or equal to a predetermined standard is input to the input terminal 22a of the controller 22. Consequently, based on the voltage value applied to the input terminal 22a, the controller 22 can determine whether a state of the board unit 20 (for example, a connection state between the board 21 and the NAND memory 25) is a normal state or an abnormal state.

<4. Layout of Daisy Chain>

Next, a layout of the daisy chain DC will be described.

Figure 6:
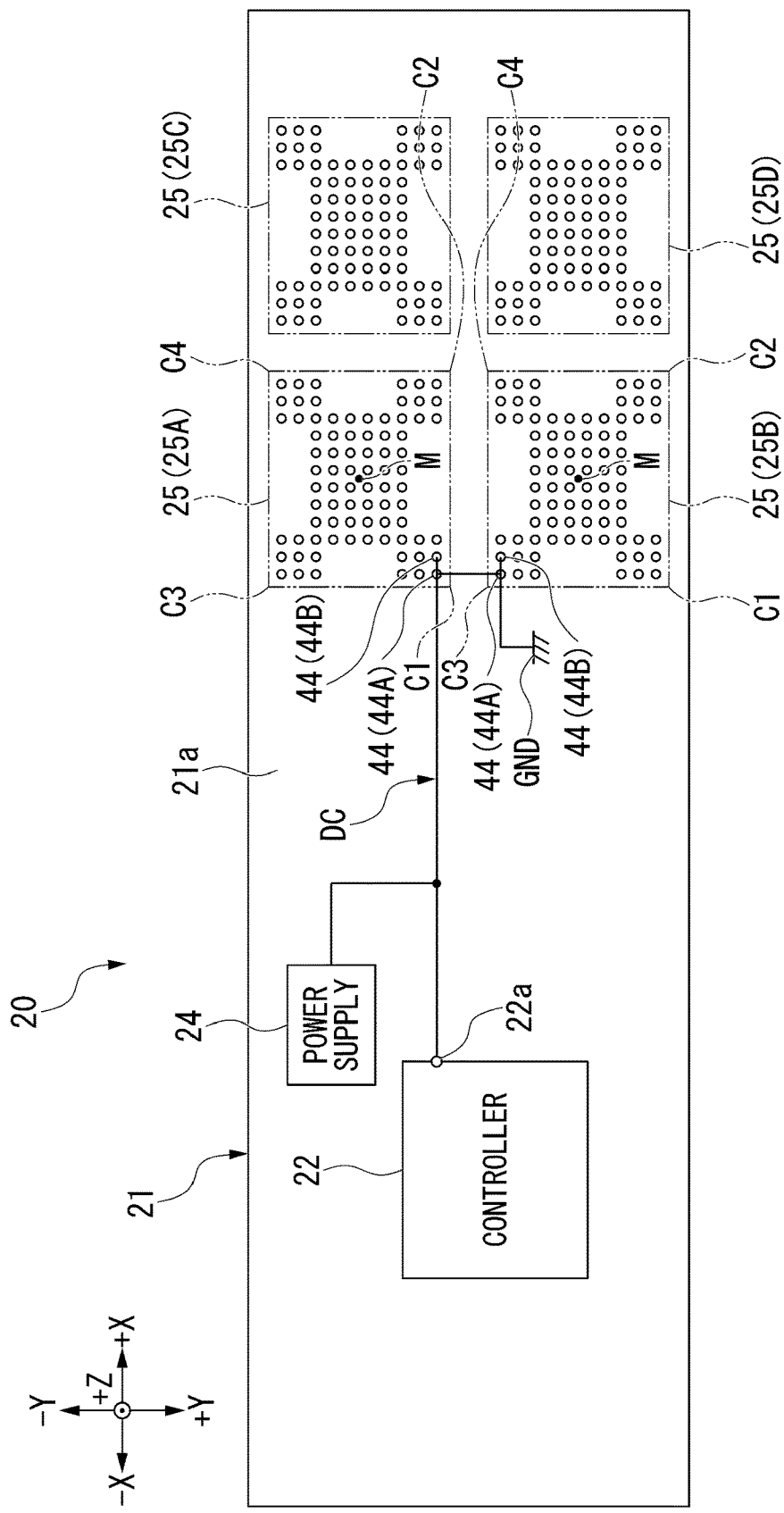
FIG. 6 is a plan view showing a board unit according to the first embodiment.
Figure 7:
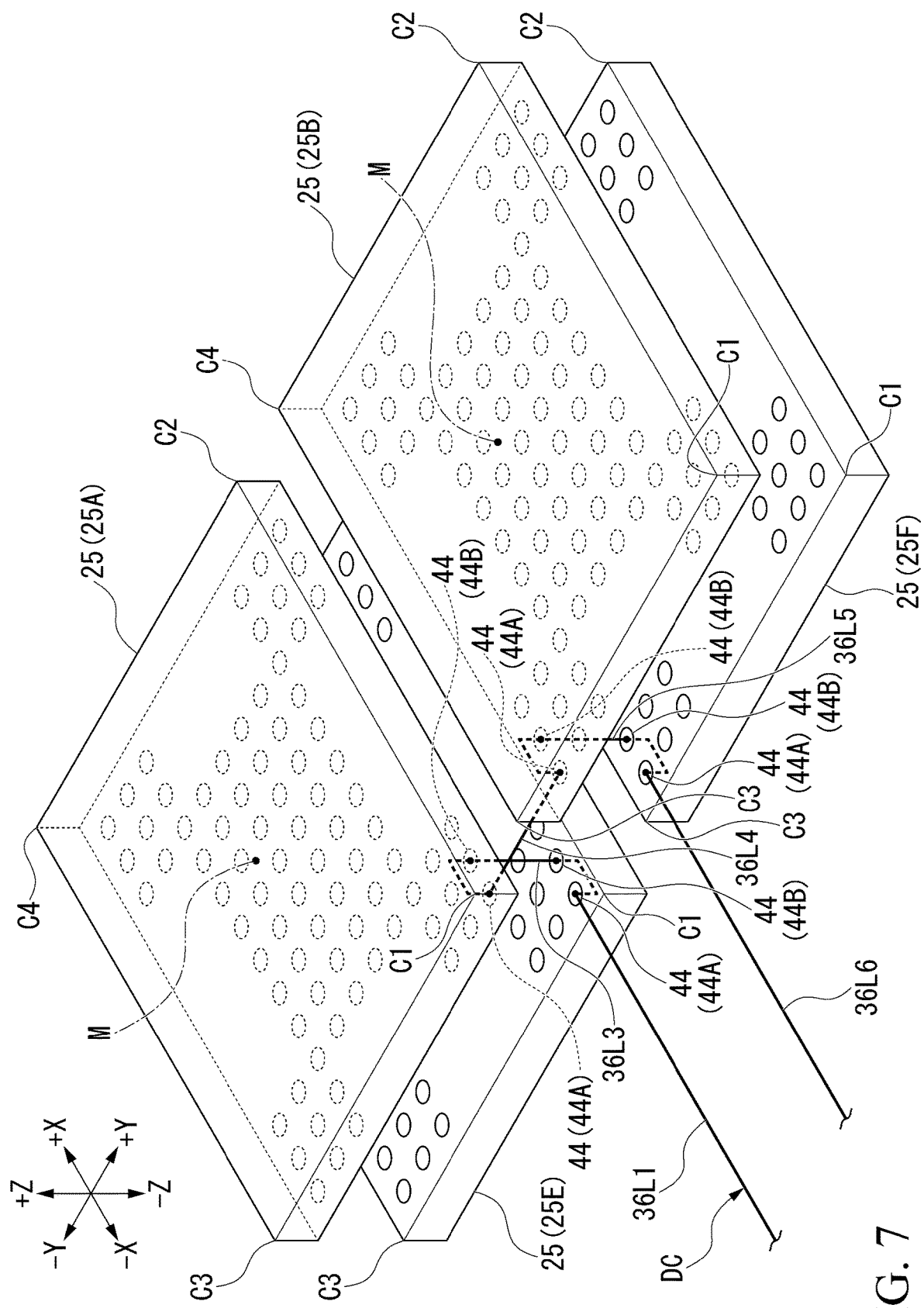
FIG. 7 is a perspective view schematically showing a part of the board unit according to the first embodiment.

FIG. 6 is a plan view showing the board unit 20. FIG. 7 is a perspective view schematically showing a part of the board unit 20. Note that, in FIG. 7, for convenience of explanation, the board 21 is not shown and each of the bonding members 44 is formed in a planar shape. Hereinbelow, for convenience of explanation, the NAND memory 25A may be referred to as a "first NAND memory 25A", the NAND memory 25E may be referred to as a "second NAND memory 25E", the NAND memory 25B may be referred to as a "third NAND memory 25B", and the NAND memory 25F may be referred to as a "fourth NAND memory 25F".

<4.1 Regarding Layout of First NAND Memory 25A>

As shown in FIG. 6, in the embodiment, the four corners C1 to C4 of the first NAND memory 25A include the corner C1 adjacent to the NAND memory 25B in the Y direction. Of the corners of the first NAND memory 25A, the corner C1 of the first NAND memory 25A is the corner on the side in the −X direction and on the side in the +Y direction.

The detection-bonding members 44A and 44B of the first NAND memory 25A are disposed so as to correspond to the corner C1 of the first NAND memory 25A. That is, when viewed from the Z direction, each of the detection-bonding members 44A and 44B included in the daisy chain DC in the first NAND memory 25A is arranged closer to the corner C1 than the center M of the first NAND memory 25A. In the present application, "a bonding member is closer to a corner than the center of the semiconductor memory" means that the distance between the bonding member and the corner is shorter than the distance between the center of the semiconductor memory and the corner.

Of the plurality of the bonding members 44 of the first NAND memory 25A, the detection-bonding member 44A is the bonding member 44 located closest to the side in the −X direction and closest to the side in the +Y direction. For example, of the plurality of the bonding members 44, the detection-bonding member 44B is the bonding member 44 included in the row located closest to the side in the +Y direction. Instead, for example, the detection-bonding member 44B may be the bonding member 44 included in the row located closest to the side in the −X direction. For example, the detection-bonding member 44B is the bonding member 44 adjacent to the detection-bonding member 44A in the X direction or in the Y direction.

On the other hand, when viewed from the Z direction, the aforementioned daisy chain DC or another daisy chain is not present between the center M of the first NAND memory 25A and each of the three corner C2, C3, and C4 except for the corner C1 of the four corners C1 to C4 of the first NAND memory 25A.

The conductive line 36L4 is connected to the detection-bonding member 44A of the first NAND memory 25A (refer to FIG. 7). The conductive line 36L4 extends in a direction away from the first NAND memory 25A. Similarly, the conductive line 36L3 is connected to the detection-bonding member 44B of the first NAND memory 25A. The conductive line 36L3 extends in a direction away from the first NAND memory 25A. In the embodiment, the first NAND memory 25A is an example of a "first semiconductor memory". The plurality of the bonding members 44 of the first NAND memory 25A include one or more first detection-bonding members. The first detection-bonding members are included in the daisy chain DC configured to detect a state associated with the first NAND memory 25A. The detection-bonding members 44A and 44B of the first NAND memory 25A are examples of "one or more first detection-bonding members". The first NAND memory 25A includes a plurality of first bonding members 44 bonded to the board 21. The first NAND memory 25A is provided at the first surface side of the board 21. The first NAND memory 25A has a first corner, a second corner, a third corner, and a fourth corner when viewed from the Z direction. The corner C1 of the first NAND memory 25A is an example of a "first corner". The corner C2 of the first NAND memory 25A is an example of a "second corner". The corner C3 of the first NAND memory 25A is an example of a "third corner". The corner C4 of the first NAND memory 25A is an example of a "fourth corner". At least one of the plurality of the first bonding members 44 is a first detection-bonding member. The first detection-bonding member corresponds to the above-described detection-bonding members 44A and 44B. The first detection-bonding member is configured to detect a connection state associated with the first NAND memory 25A and the second NAND memory 25E. The first detection-bonding member is configured to be electrically connected to the controller 22, a power supply terminal, and a ground terminal, via the wiring. The power supply terminal is configured to supply a power supply voltage to the semiconductor storage device 1. The ground terminal is configured to supply ground potential to the semiconductor storage device 1. In the first NAND memory 25A, the plurality of the first bonding members include a first group and a second group. The first group includes one part of the plurality of the first bonding members of the first NAND memory 25A. The second group includes the other part of the plurality of the first bonding members. Here, the first group of the first NAND memory 25A corresponds to the first bonding group G1, the third bonding group G3, the fourth bonding group G4, and the fifth bonding group G5 of the first NAND memory 25A. The second group of the first NAND memory 25A corresponds to the second bonding group G2 of the first NAND memory 25A. In the first NAND memory 25A, the second group is at a position closer to the first corner than the first group. The second group includes the first detection-bonding member. The second group is closer to the first corner than the second corner, the third corner, and the fourth corner.

<4.2 Regarding Layout of Second NAND Memory 25E>

The second NAND memory 25E overlaps at least a part of the first NAND memory 25A. The board 21 is sandwiched between the second NAND memory 25E and the first NAND memory 25A in the Z direction. At least a part of the above-described conductive line 36L3 extends in the Z direction in the board 21 between the first NAND memory 25A and the second NAND memory 25E. In other words, the conductive line 36L3 at least has a conductive-line portion extending in the board 21 in the Z direction. For example, at least a part of the conductive line 36L3 is a through hole provided in the board 21. The conductive line 36L3 is connected to the detection-bonding member 44B of the second NAND memory 25E on the second surface 21b of the board 21. The conductive line 36L3 is an example of a "first conductive line" or a "wiring". In other words, the wiring includes the conductive line 36L3.

In the embodiment, when viewed from the Z direction, of the four corners C1 to C4 of the second NAND memory 25E, the second NAND memory 25E has the corner C1 closest to the corner C1 of the first NAND memory 25A. For example, of the corners of the second NAND memory 25E, the corner C1 of the second NAND memory 25E is the corner on the side in the −X direction and on the side in the +Y direction.

The detection-bonding members 44A and 44B of the second NAND memory 25E are disposed so as to correspond to the corner C1 of the second NAND memory 25E. That is, when viewed from the Z direction, each of the detection-bonding members 44A and 44B included in the daisy chain DC in the second NAND memory 25E is arranged closer to the corner C1 than the center M of the second NAND memory 25E.

Of the plurality of the bonding members 44 of the second NAND memory 25E, the detection-bonding member 44A is the bonding member 44 located closest to the side in the −X direction and closest to the side in the +Y direction. For example, of the plurality of the bonding members 44, the detection-bonding member 44B is the bonding member 44 included in the row located closest to the side in the +Y direction. Instead, for example, the detection-bonding member 44B may be the bonding member 44 included in the row located closest to the side in the −X direction. For example, the detection-bonding member 44B is the bonding member 44 adjacent to the detection-bonding member 44A in the X direction or in the Y direction.

On the other hand, when viewed from the Z direction, the aforementioned daisy chain DC or another daisy chain is not present between the center M of the second NAND memory 25E and each of the three corner C2, C3, and C4 except for the corner C1 of the four corners C1 to C4 of the second NAND memory 25E.

The conductive line 36L1 is connected to the detection-bonding member 44A of the second NAND memory 25E. The conductive line 36L1 extends in a direction away from the second NAND memory 25E. In the embodiment, the second NAND memory 25E is an example of a "second semiconductor memory". The plurality of the bonding members 44 of the second NAND memory 25E include one or more second detection-bonding members. The second detection-bonding members are included in the daisy chain DC. The daisy chain DC is configured to also detect a state associated with the second NAND memory 25E. The detection-bonding members 44A and 44B of the second NAND memory 25E are examples of "one or more second detection-bonding members". The second NAND memory 25E includes a plurality of second bonding members 44 bonded to the board 21. The second NAND memory 25E is provided at the second surface side of the board 21. The first NAND memory 25A and the second NAND memory 25E may be provided at the first surface side of the board 21. The second NAND memory 25E overlaps at least part of the first NAND memory 25A when viewed from the Z direction. The second NAND memory 25E has a fifth corner, a sixth corner, a seventh corner, and an eighth corner when viewed from the Z direction. The corner C1 of the second NAND memory 25E is an example of a "fifth corner". The corner C2 of the second NAND memory 25E is an example of a "sixth corner". The corner C3 of the second NAND memory 25E is an example of a "seventh corner". The corner C4 of the second NAND memory 25E is an example of an "eighth corner". At least one of the plurality of the second bonding members 44 is a second detection-bonding member. The second detection-bonding member corresponds to the above-described detection-bonding members 44A and 44B. The second detection-bonding member is electrically connected to the first detection-bonding member. The second detection-bonding member is configured to detect a connection state associated with the first NAND memory 25A and the second NAND memory 25E. The second detection-bonding member is configured to be electrically connected to the controller 22, a power supply terminal, and a ground terminal, via the wiring. The power supply terminal is configured to supply a power supply voltage to the semiconductor storage device 1. The ground terminal is configured to supply ground potential to the semiconductor storage device 1. In the second NAND memory 25E, the plurality of the second bonding members include a third group and a fourth group. The third group includes one part of the plurality of the second bonding members. The fourth group includes the other part of the plurality of the second bonding members. Here, the third group of the second NAND memory 25E corresponds to the first bonding group G1, the third bonding group G3, the fourth bonding group G4, and the fifth bonding group G5 of the second NAND memory 25E. The second group of the second NAND memory 25E corresponds to the second bonding group G2 of the second NAND memory 25E. In the second NAND memory 25E, the fourth group is at a position closer to the fifth corner than the third group. The fourth group includes the second detection-bonding member. The fourth group is closer to the fifth corner than the sixth corner, the seventh corner, and the eighth corner. The fifth corner of the second NAND memory 25E is closer to the first corner of the first NAND memory 25A than the sixth corner, the seventh corner, and the eighth corner of the second NAND memory 25E. The first corner of the first NAND memory 25A is closer to the fifth corner of the second NAND memory 25E than the second corner, the third corner, and the fourth corner of the first NAND memory 25A.

<4.3 Regarding Layout of Third NAND Memory 25B>

The third NAND memory 25B is adjacent to the first NAND memory 25A in the Y direction. Between the first NAND memory 25A and the third NAND memory 25B, at least a part of the conductive line 36L4 extends along a surface layer of the board 21 or extends in an inner layer of the board 21. The conductive line 36L4 is connected to the detection-bonding member 44A of the third NAND memory 25B on the first surface 21a of the board 21. The conductive line 36L4 is an example of a "second conductive line" or a "wiring". In other words, the wiring includes the conductive line 36L4.

In the embodiment, when viewed from the Z direction, of the four corners C1 to C4 of the third NAND memory 25B, the third NAND memory 25B has the corner C3 closest to the corner C1 of the first NAND memory 25A. For example, of the corners of the third NAND memory 25B, the corner C3 of the third NAND memory 25B is the corner on the side in the −X direction and on the side in the −Y direction.

The detection-bonding members 44A and 44B of the third NAND memory 25B are disposed so as to correspond to the corner C3 of the third NAND memory 25B. That is, when viewed from the Z direction, each of the detection-bonding members 44A and 44B included in the daisy chain DC in the third NAND memory 25B is arranged closer to the corner C3 than the center M of the third NAND memory 25B.

Of the plurality of the bonding members 44 of the third NAND memory 25B, the detection-bonding member 44A is the bonding member 44 located closest to the side in the −X direction and closest to the side in the −Y direction. For example, of the plurality of the bonding members 44, the detection-bonding member 44B is the bonding member 44 included in the row located closest to the side in the −Y direction. Instead, for example, the detection-bonding member 44B may be the bonding member 44 included in the row located closest to the side in the −X direction. For example, the detection-bonding member 44B is the bonding member 44 adjacent to the detection-bonding member 44A in the X direction or in the Y direction.

On the other hand, when viewed from the Z direction, the aforementioned daisy chain DC or another daisy chain is not present between the center M of the third NAND memory 25B and each of the three corner C1, C2, and C4 except for the corner C3 of the four corners C1 to C4 of the third NAND memory 25B.

The conductive line 36L5 is connected to the detection-bonding member 44B of the third NAND memory 25B. The conductive line 36L5 extends in a direction away from the third NAND memory 25B. In the embodiment, the third NAND memory 25B is an example of a "first semiconductor memory". In other words, the third NAND memory 25B has a configuration corresponding to the above-described first NAND memory 25A. That is, the third NAND memory 25B includes a plurality of first bonding members 44 bonded to the board 21. The third NAND memory 25B is provided at the first surface side of the board 21. The third NAND memory 25B has a first corner, a second corner, a third corner, and a fourth corner when viewed from the Z direction. The corner C1 of the third NAND memory 25B is an example of a "first corner". The corner C2 of the third NAND memory 25B is an example of a "second corner". The corner C3 of the third NAND memory 25B is an example of a "third corner". The corner C4 of the third NAND memory 25B is an example of a "fourth corner". At least one of the plurality of the first bonding members 44 is a first detection-bonding member. The first detection-bonding member corresponds to the above-described detection-bonding members 44A and 44B. The first detection-bonding member is configured to detect a connection state associated with the third NAND memory 25B and the fourth NAND memory 25F. The first detection-bonding member is configured to be electrically connected to the controller 22, a power supply terminal, and a ground terminal, via the wiring. The power supply terminal is configured to supply a power supply voltage to the semiconductor storage device 1. The ground terminal is configured to supply ground potential to the semiconductor storage device 1. In the third NAND memory 25B, the plurality of the first bonding members include a first group and a second group. The first group includes one part of the plurality of the first bonding members of the third NAND memory 25B. The second group includes the other part of the plurality of the first bonding members. Here, the first group of the third NAND memory 25B corresponds to the first bonding group G1, the third bonding group G3, the fourth bonding group G4, and the fifth bonding group G5 of the third NAND memory 25B. The second group of the third NAND memory 25B corresponds to the second bonding group G2 of the third NAND memory 25B. In the third NAND memory 25B, the second group is at a position closer to the first corner than the first group. The second group includes the first detection-bonding member. The second group is closer to the first corner than the second corner, the third corner, and the fourth corner.

<4.4 Regarding Layout of Fourth NAND Memory 25F>

The fourth NAND memory 25F is adjacent to the second NAND memory 25E in the Y direction. The fourth NAND memory 25F overlaps at least a part of the third NAND memory 25B. The board 21 is sandwiched between the fourth NAND memory 25F and the third NAND memory 25B in the Z direction. At least a part of the above-described conductive line 36L5 extends in the Z direction in the board 21 between the third NAND memory 25B and the fourth NAND memory 25F. For example, at least a part of the conductive line 36L5 is a through hole provided in the board 21. The conductive line 36L5 is connected to the detection-bonding member 44B of the fourth NAND memory 25F on the second surface 21b of the board 21.

In the embodiment, when viewed from the Z direction, of the four corners C1 to C4 of the fourth NAND memory 25F, the fourth NAND memory 25F has the corner C3 closest to the corner C3 of the third NAND memory 25B. For example, of the corners of the fourth NAND memory 25F, the corner C3 of the fourth NAND memory 25F is the corner on the side in the −X direction and on the side in the −Y direction.

The detection-bonding members 44A and 44B of the fourth NAND memory 25F are disposed so as to correspond to the corner C3 of the fourth NAND memory 25F. That is, when viewed from the Z direction, each of the detection-bonding members 44A and 44B included in the daisy chain DC in the fourth NAND memory 25F is arranged closer to the corner C3 than the center M of the fourth NAND memory 25F. In the embodiment, of the plurality of the bonding members 44, the detection-bonding member 44A is the bonding member 44 located closest to the side in the −X direction and closest to the side in the −Y direction. For example, of the plurality of the bonding members 44, the detection-bonding member 44B is the bonding member 44 included in the row located closest to the side in the −Y direction. Instead, for example, the detection-bonding member 44B may be the bonding member 44 included in the row located closest to the side in the −X direction. For example, the detection-bonding member 44B is the bonding member 44 adjacent to the detection-bonding member 44A in the X direction or in the Y direction.

On the other hand, when viewed from the Z direction, the aforementioned daisy chain DC or another daisy chain is not present between the center M of the fourth NAND memory 25F and each of the three corner C1, C2, and C4 except for the corner C3 of the four corners C1 to C4 of the fourth NAND memory 25F.

The conductive line 36L6 is connected to the detection-bonding member 44A of the fourth NAND memory 25F. The conductive line 36L6 extends in a direction away from the fourth NAND memory 25F. The conductive line 36L6 is connected to the ground GND. In the embodiment, the fourth NAND memory 25F is an example of a "second semiconductor memory". In other words, the fourth NAND memory 25F has a configuration corresponding to the above-described second NAND memory 25E. That is, the fourth NAND memory 25F includes a plurality of second bonding members 44 bonded to the board 21. The fourth NAND memory 25F is provided at the second surface side of the board 21. The third NAND memory 25B and the fourth NAND memory 25F may be provided at the first surface side of the board 21. The fourth NAND memory 25F overlaps at least part of the third NAND memory 25B when viewed from the Z direction. The fourth NAND memory 25F has a fifth corner, a sixth corner, a seventh corner, and an eighth corner when viewed from the Z direction. The corner C1 of the fourth NAND memory 25F is an example of a "fifth corner". The corner C2 of the fourth NAND memory 25F is an example of a "sixth corner". The corner C3 of the fourth NAND memory 25F is an example of a "seventh corner". The corner C4 of the fourth NAND memory 25F is an example of an "eighth corner". At least one of the plurality of the second bonding members 44 is a second detection-bonding member. The second detection-bonding member corresponds to the above-described detection-bonding members 44A and 44B. The second detection-bonding member is electrically connected to the first detection-bonding member. The second detection-bonding member is configured to detect a connection state associated with the third NAND memory 25B and the fourth NAND memory 25F. The second detection-bonding member is configured to be electrically connected to the controller 22, a power supply terminal, and a ground terminal, via the wiring. The power supply terminal is configured to supply a power supply voltage to the semiconductor storage device 1. The ground terminal is configured to supply ground potential to the semiconductor storage device 1. In the fourth NAND memory 25F, the plurality of the second bonding members include a third group and a fourth group. The third group includes one part of the plurality of the second bonding members. The fourth group includes the other part of the plurality of the second bonding members. Here, the third group of the fourth NAND memory 25F corresponds to the first bonding group G1, the third bonding group G3, the fourth bonding group G4, and the fifth bonding group G5 of the fourth NAND memory 25F. The second group of the fourth NAND memory 25F corresponds to the second bonding group G2 of the fourth NAND memory 25F. In the fourth NAND memory 25F, the fourth group is at a position closer to the fifth corner than the third group. The fourth group includes the second detection-bonding member. The fourth group is closer to the fifth corner than the sixth corner, the seventh corner, and the eighth corner. The fifth corner of the fourth NAND memory 25F is closer to the first corner of the third NAND memory 25B than the sixth corner, the seventh corner, and the eighth corner of the fourth NAND memory 25F. The first corner of the third NAND memory 25B is closer to the fifth corner of the fourth NAND memory 25F than the second corner, the third corner, and the fourth corner of the third NAND memory 25B.

<5. Action>

In the embodiment, in a case in which there is no defect in a connection state between the board 21 and each of the four NAND memories 25, a voltage less than a predetermined standard (for example, 0V) is input to the input terminal 22a of the controller 22. In the case in which a voltage less than the aforementioned predetermined standard is input to the input terminal 22a, the controller 22 determines that the board unit 20 is normal.

On the other hand, in a case in which there is a defect in a connection state between the board 21 and each of the four NAND memories 25 (for example, fracture or peeling occurs in the bonding member), a voltage higher than or equal to the aforementioned predetermined standard is input to the input terminal 22a of the controller 22. In the case in which a voltage higher than or equal to the aforementioned predetermined standard is input to the input terminal 22a, the controller 22 determines that a defect has occurred in the board unit 20.

<6. Advantage>

Generally, a physical analysis such as an ink immersion test (dye and pry) or the like is necessary to detect fracture or peeling of a board or a component. In the case of carrying out such a physical analysis, the board or the component cannot be returned to its original state. Therefore, in a case in which the cause of failure is not the detected fracture or the peeling of the board or the component, the cause of failure may not be specified.

On the other hand, in the embodiment, the first NAND memory 25A includes one or more detection-bonding members, that is, the detection-bonding members 44A and 44B. The detection-bonding members 44A and 44B are included in the daisy chain DC configured to detect a state associated with the first NAND memory 25A. With this configuration, it is possible to electrically detect fracture or peeling of a board or a component without carrying out physical analysis. Accordingly, it is possible to increase a degree of ease of detecting a state of the semiconductor storage device 1. For example, it is possible to increase a degree of ease of detecting a defect state or a degradation state of the semiconductor storage device 1.

Here, according to independent research carried out by the inventors, it is apparent that a defect is likely to occur at the bonding members 44 arranged close to the four corners C1 to C4, of the plurality of the bonding members 44 of the NAND memory 25. Furthermore, it is apparent that the defect often occurs at the plurality of the bonding members 44 corresponding to the four corners C1 to C4 at substantially the same time. Particularly, according to the independent research carried out by the inventors, it is possible to presume a connection state of the entirety of the NAND memory 25 by detecting a state of the bonding member 44 arranged close to one corner optionally selected from the four corners C1 to C4.

Consequently, in the embodiment, when viewed from the Z direction, each of the detection-bonding members 44A and 44B included in the daisy chain DC of the first NAND memory 25A is arranged closer to one corner C1 than the center M of the first NAND memory 25A. With this configuration, the daisy chain DC is disposed at the position close to one corner C1 optionally selected from the corners of the first NAND memory 25A, and the daisy chain DC is not disposed at the positions corresponding to the remaining three corners C2, C3, and C4. According to this configuration, the daisy chain DC is less likely to interfere with a layout regarding wirings for signal transmission or power supply. Furthermore, it is possible to increase a degree of ease of drawing the wirings of the NAND memory 25. As a result, a further high-density packaging of the semiconductor storage device 1 can be achieved.

In the embodiment, the second NAND memory 25E overlaps at least a part of the first NAND memory 25A in the Z direction. One or more bonding members 44 of the first NAND memory 25A and one or more bonding members 44 of the second NAND memory 25E are included in the same daisy chain DC. With this configuration, by providing one daisy chain DC with respect to the two NAND memories 25A and 25E overlapping each other in the Z direction, it is possible to collect the daisy chain DC in a compact form. For this reason, the daisy chain DC is further less likely to interfere with a layout of other wirings, and it is possible to further increase a degree of ease of drawing the wirings of the NAND memory 25.

In the embodiment, of the four corners C1 to C4 of the second NAND memory 25E, the second NAND memory 25E has the corner C1 closest to the corner C1 of the first NAND memory 25A. When viewed from the Z direction, each of the bonding members 44 included in the daisy chain DC in the second NAND memory 25E is arranged closer to the corner C1 of the second NAND memory 25E than the center M of the second NAND memory 25E. With this configuration, it is possible to further reduce an area necessary for the daisy chain DC.

In the embodiment, the first NAND memory 25A and the third NAND memory 25B are mounted on the first surface 21a of the board 21 and are adjacent to each other in the Y direction. One or more bonding members 44 of the third NAND memory 25B are included in the daisy chain DC. With this configuration, by providing one daisy chain DC with respect to the two NAND memories 25A and 25B arranged side by side in the Y direction, it is possible to collect the daisy chain DC in a compact form. For this reason, the daisy chain DC is further less likely to interfere with a layout of other wirings, and it is possible to further increase a degree of ease of drawing the wirings of the NAND memory 25.

In the embodiment, of the four corners C1 to C4 of the third NAND memory 25B, the third NAND memory 25B has the corner C3 closest to the corner C1 of the first NAND memory 25A. When viewed from the Z direction, each of the bonding members 44 included in the daisy chain DC in the third NAND memory 25B is arranged closer to the corner C3 of the third NAND memory 25B than the center M of the third NAND memory 25B. With this configuration, it is possible to further reduce an area necessary for the daisy chain DC.

In the embodiment, of the four corners C1 to C4 of the fourth NAND memory 25F, the fourth NAND memory 25F has the corner C3 closest to the corner C3 of the third NAND memory 25B. When viewed from the Z direction, each of the bonding members 44 included in the daisy chain DC in the fourth NAND memory 25F is arranged closer to the corner C3 of the fourth NAND memory 25F than the center M of the fourth NAND memory 25F. With this configuration, it is possible to further reduce an area necessary for the daisy chain DC.

In the embodiment, the second NAND memory 25E and the fourth NAND memory 25F are mounted on the second surface 21b of the board 21 and are adjacent to each other in the Y direction. One or more bonding members 44 of the fourth NAND memory 25F are included in the daisy chain DC. With this configuration, by providing one daisy chain DC with respect to the two NAND memories 25E and 25F arranged side by side in the Y direction, it is possible to collect the daisy chain DC in a compact form. For this reason, the daisy chain DC is further less likely to interfere with a layout of other wirings, and it is possible to further increase a degree of ease of drawing the wirings of the NAND memory 25.

Modified Example of First Embodiment

Figure 8:
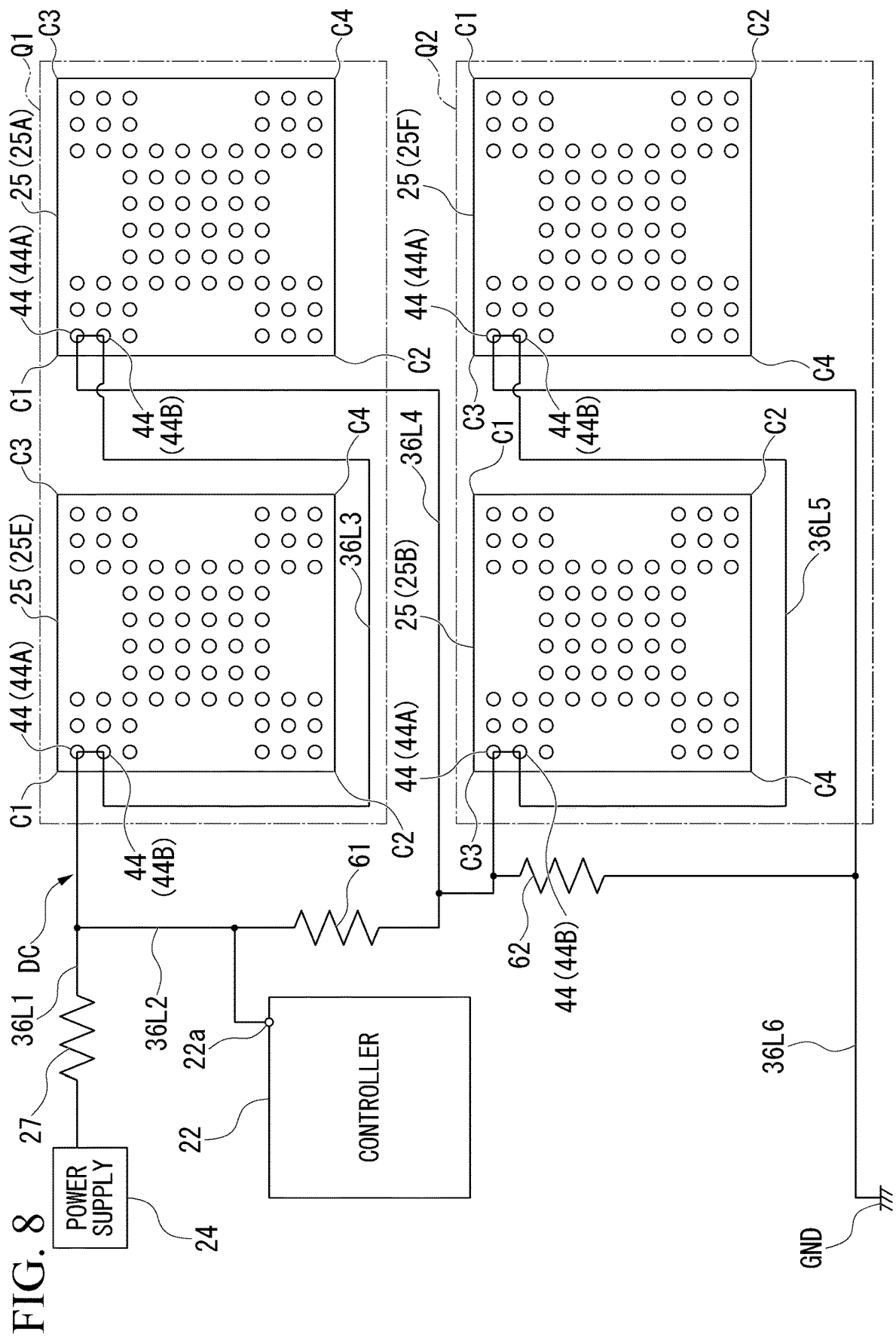
FIG. 8 is a view explaining a connection relationship of a daisy chain according to a modified example of the first embodiment.

FIG. 8 is a view explaining a connection relationship of the daisy chain DC according to a modified example of the first embodiment. In the modified example, the plurality of the NAND memories 25 are separated into a plurality of bonding groups Q1 and Q2. For example, the plurality of the NAND memories 25 has a first bonding group Q1 and a second bonding group Q2. One or more NAND memories 25 (for example, the two NAND memories 25A and 25E) are included in the first bonding group Q1. One or more NAND memories 25 (for example, the two NAND memories 25B and 25F) are included in second bonding group Q2. The first bonding group Q1 is an example of a "first memory group". The second bonding group Q1 is an example of a "second memory group".

In the modified example, the board unit 20 includes a first resistance element 61 and a second resistance element 62. The first resistance element 61 is an example of a "first resistor". The second resistance element 62 is an example of a "second resistor". The first resistance element 61 is electrically connected in parallel to the NAND memories 25 (for example, the NAND memories 25A and 25E) included in the first bonding group Q1 on the daisy chain DC. The first resistance element 61 is electrically connected in parallel to the first detection-bonding member. For example, one end of the first resistance element 61 is connected to the conductive line 36L1 via the conductive line 36L2. The other end of the first resistance element 61 is connected to the conductive line 36L4.

On the other hand, the second resistance element 62 is electrically connected in parallel to the NAND memories 25 (for example, the NAND memories 25B and 25F) included in the second bonding group Q2 on the daisy chain DC. The second resistance element 62 is electrically connected in parallel to the second detection-bonding member. For example, one end of the second resistance element 62 is connected to the conductive line 36L4. The other end of the second resistance element 62 is connected to the conductive line 36L6. The second resistance element 62 has a resistance value different from that of the first resistance element 61.

With this configuration, in a case in which a defect has occurred in at least one of the NAND memories 25, based on a voltage drop, it is possible to determine whether or not a defect has occurred in the NAND memories 25 included in the first bonding group Q1 and whether or not a defect has occurred in the NAND memories 25 included in the first bonding group Q2. Accordingly, it is possible to further increase a degree of ease of detecting a state of the semiconductor storage device 1.

Second Embodiment

Next, a second embodiment will be described. The second embodiment is different from the first embodiment in that: one NAND memory 25 is provided with one detection-bonding member 44A; and a pad 35S to which the detection-bonding member 44A is connected is separated into two pads. Note that, configurations other than those described below are the same as those of the first embodiment.

Figure 9:
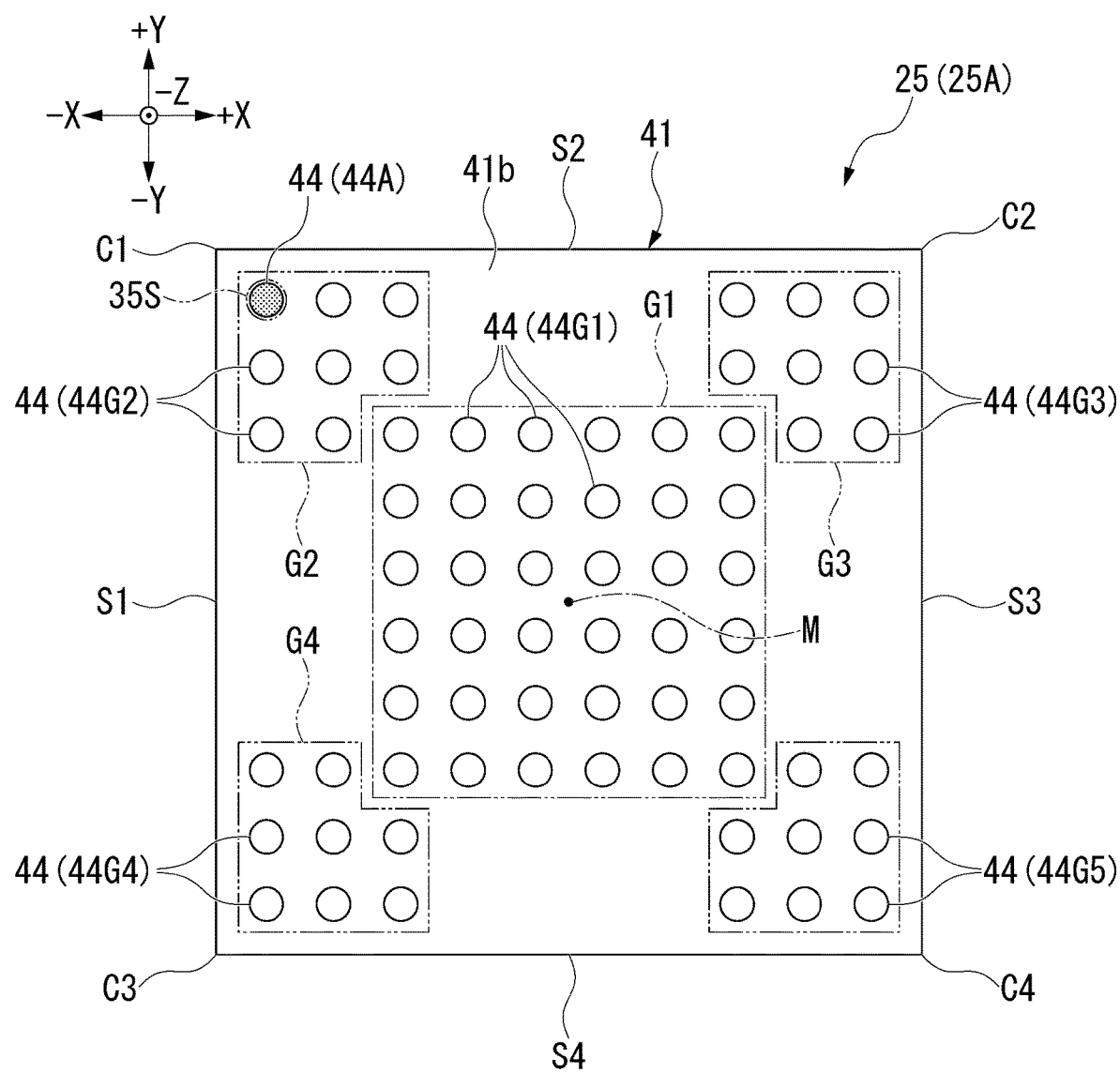
FIG. 9 is a view explaining a configuration of the semiconductor memory according to a second embodiment.

FIG. 9 is a view explaining a configuration of the NAND memory 25 according to the second embodiment. In the embodiment, one bonding member 44 closest to one corner of the corners C1 to C4 of the plurality of the bonding members 44 of the NAND memory 25 is the detection-bonding member 44A. In other words, the detection-bonding member 44A is a so-called corner bump. The detection-bonding member 44A is included in the daisy chain DC. The detection-bonding member 44A is disposed so as to correspond to one corner of the four corners C1 to C4 of the NAND memory 25. For example, FIG. 9 shows that the detection-bonding member 44A is disposed so as to correspond to the corner C1. The detection-bonding member 44A is an example of a "first bonding member" and is an example of a "first bonding member serving as one electrical conductor". In the present application, "one electrical conductor" means an electrical conductor that is present as one agglomeration part and is not separated into a plurality of parts.

Figure 10:
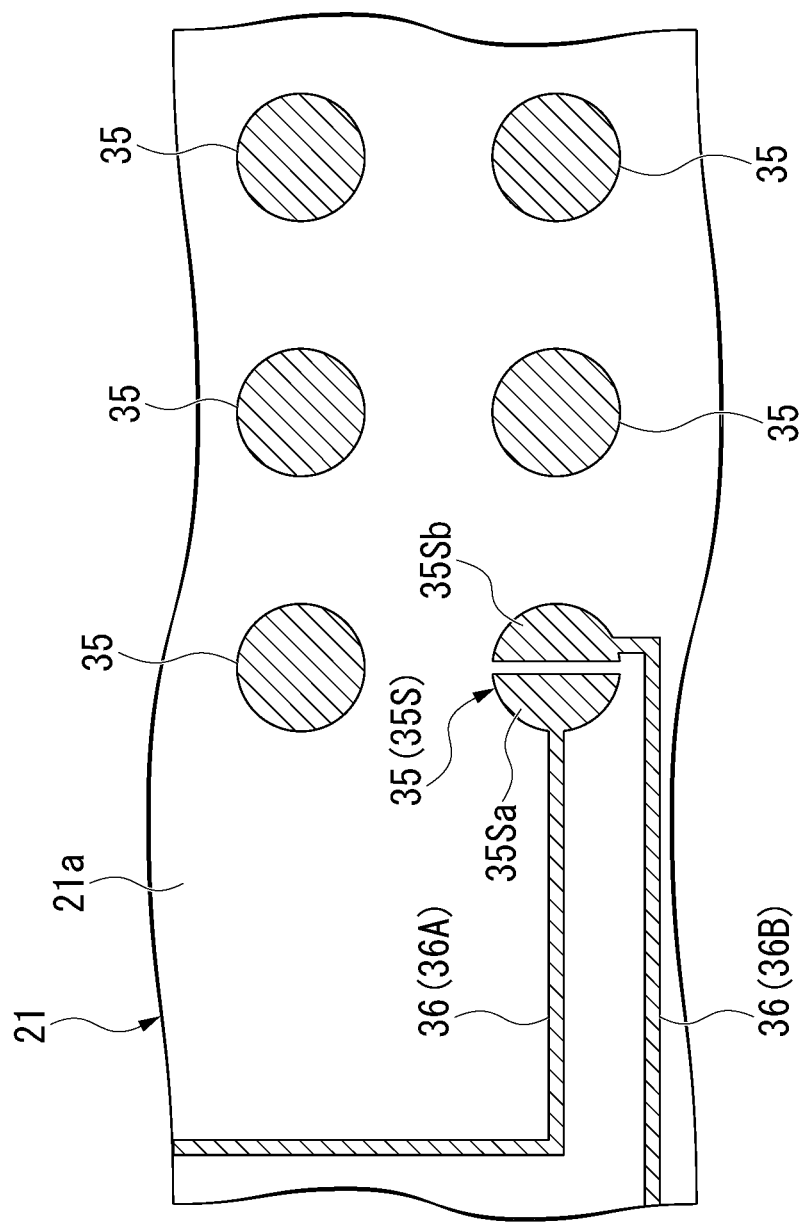
FIG. 10 is a plan view showing a board according to the second embodiment.

FIG. 10 is a plan view showing the board 21 according to the embodiment. The board 21 includes the plurality of pads 35. The pads 35 are connected to the plurality of the bonding members 44 of the NAND memory 25. The plurality of the pads 35 include the pad 35S connected to the detection-bonding members 44A. The pad 35S includes a first portion 35Sa (first sub pad) and a second portion 35Sb (second sub pad). The first portion 35Sa and the second portion 35Sb are separated from each other. One part of the detection-bonding member 44A is connected to the first portion 35Sa. The other part of the detection-bonding member 44A is connected to the second portion 35Sb. In a state in which the detection-bonding member 44A is not connected to the pad 35S, the first portion 35Sa and the second portion 35Sb are insulated from each other. In a state in which the detection-bonding member 44A is connected to the pad 35S, the first portion 35Sa is electrically connected to the second portion 35Sb via the detection-bonding member 44A. Each of the first portion 35Sa and the second portion 35Sb is formed in, for example, a semicircular shape. When viewed from the Z direction, the detection-bonding member 44A and the pad 35S have substantially the same size as each other. In the present application, "substantially the same size as each other" means that, for example, the difference between the maximum size of the detection-bonding member 44A and the maximum size of the pad 35S is less than or equal to 10% of the maximum size of the pad 35S on the bonded surface between the detection-bonding member 44A and the pad 35S. For example, the total of the surface area of the first portion 35Sa and the surface area of the second portion 35Sb is smaller than the surface area of the detection-bonding member 44A. In the present application, "the surface area of the detection-bonding member 44A" is, for example, a projected area of the detection-bonding member 44A when viewed from the Z direction.

In the embodiment, the pad 35S is disposed so as to correspond to one corner of the four corners C1 to C4 of the NAND memory 25. In other words, "one corner of the four corners C1 to C4" may be referred to as "a corner optionally selected from the four corners C1 to C4" or "optionally selected corner of the four corners C1 to C4". In the present application, for example, "the pads 35S are disposed so as to correspond to one corner" means that the pads 35S are disposed at the positions at which the pads are connected to the bonding members 44 included in the bonding group closest to the optionally selected corner, of the second bonding group G2 to the fifth bonding group G5 mentioned above. For example, FIG. 9 shows that the pads 35S are disposed so as to correspond to the corner C1. In this case, the bonding members 44 included in the second bonding group G2 are connected to the pads 35S. Note that, seen from another point of view, "the pads 35S are disposed so as to correspond to one corner" or "the pads 35S are disposed so as to correspond to the optionally selected corner" means that the pads 35S are connected to the bonding members 44 included in, for example, a grid array. Specifically, regarding the array of bonding members 44, the NAND memory 25 includes a grid array defined by: a plurality of rows closest to the optionally selected corner (i.e., one corner of the four corners C1 to C4) such as three or less rows extending along the X direction; and a plurality of rows closest to the optionally selected corner such as three or less rows extending along the Y direction. In other words, the NAND memory 25 includes a three-by-three grid array.

Figure 11:
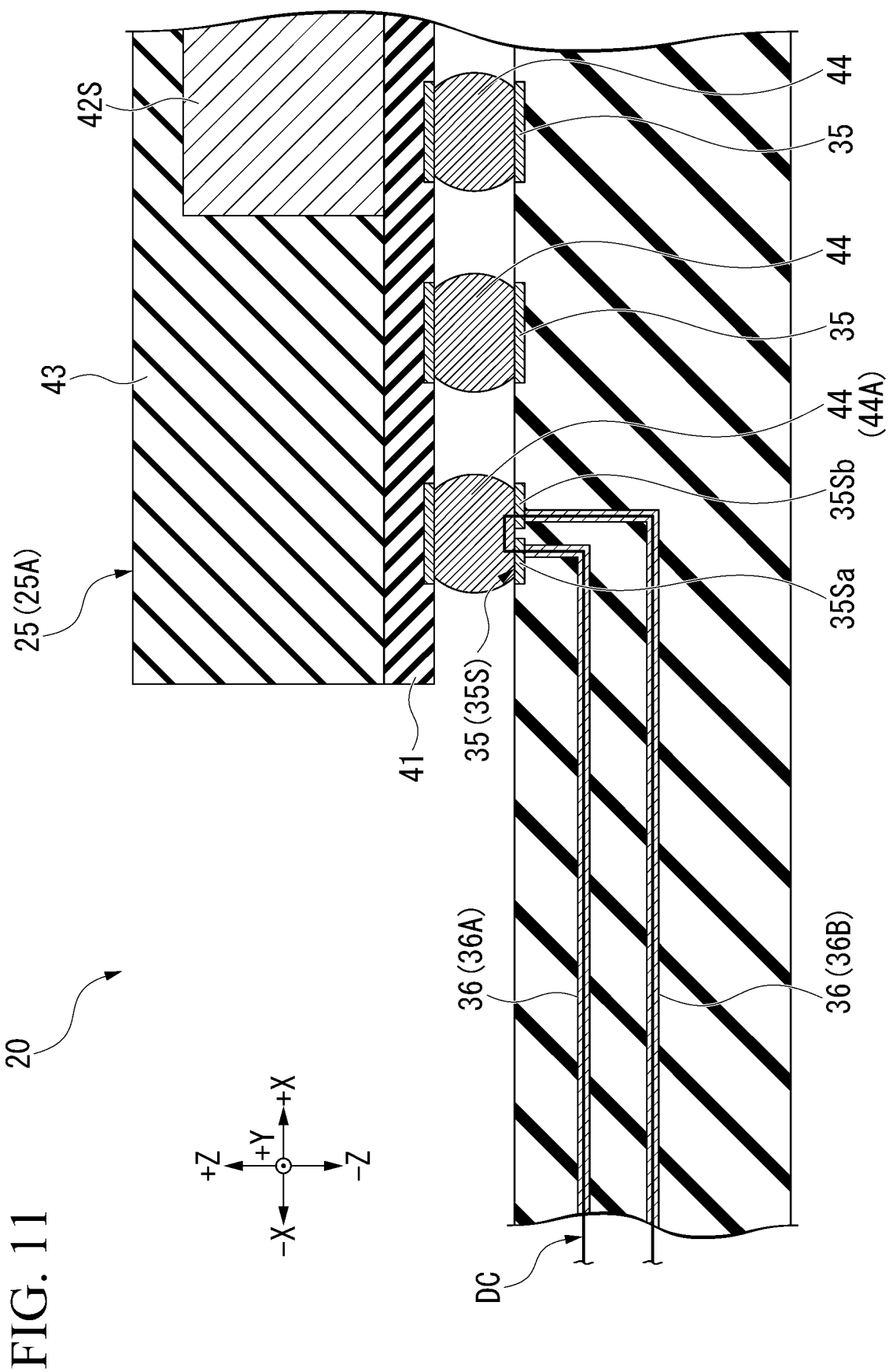
FIG. 11 is a view explaining a part of a daisy chain according to the second embodiment.

FIG. 11 is a view explaining a part of the daisy chain DC according to the embodiment. A part of the detection-bonding member 44 is connected to the first portion 35Sa of the pad 35S. Another part of the detection-bonding member 44 is connected to the second portion 35Sb of the pad 35S. The conductive line 36A is connected to the first portion 35Sa of the pad 35S. The conductive line 36B is connected to the second portion 35Sb of the pad 35S.

Figure 12:
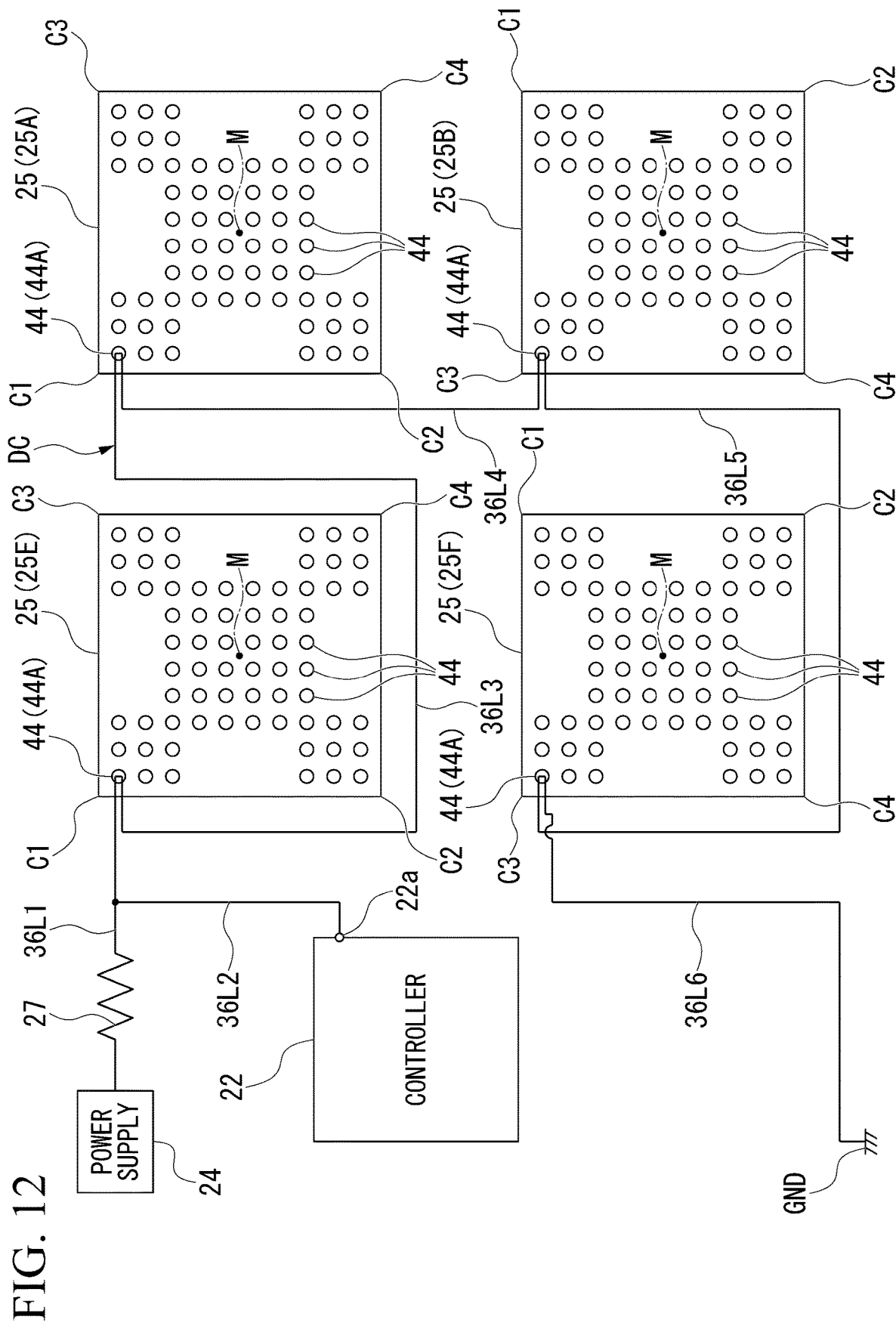
FIG. 12 is a view explaining a connection relationship of the daisy chain according to the second embodiment.

FIG. 12 is a view explaining a connection relationship of the daisy chain DC. In the embodiment, the daisy chain DC includes: the conductive lines 36L1 to 36L6 included in the plurality of the conductive lines 36 of the board 21; and the detection-bonding member 44A included in each of the four NAND memories 25A, 25B, 25E, and 25F. Note that, in FIG. 12, the pads 35 of the board 21 are omitted.

One end of the conductive line 36L1 is connected to the power supply circuit component 24 (power supply) via a resistance element 27. The power supply circuit component 24 is configured to apply a voltage to the conductive line 36L1. The other end of the conductive line 36L1 is connected to the first portion 35Sa of the pad 35S corresponding to the detection-bonding member 44A of the NAND memory 25E. One end of the conductive line 36L3 is connected to the second portion 35Sb of the pad 35S corresponding to the detection-bonding member 44A of the NAND memory 25E.

The other end of the conductive line 36L3 is connected to the first portion 35Sa of the pad 35S corresponding to the detection-bonding member 44A of the NAND memory 25A. One end of the conductive line 36L4 is connected to the second portion 35Sb of the pad 35S corresponding to the detection-bonding member 44A of the NAND memory 25A. The other end of the conductive line 36L4 is connected to the first portion 35Sa of the pad 35S corresponding to the detection-bonding member 44A of the NAND memory 25B. One end of the conductive line 36L5 is connected to the second portion 35Sb of the pad 35S corresponding to the detection-bonding member 44A of the NAND memory 25B.

The other end of the conductive line 36L5 is connected to the first portion 35Sa of the pad 35S corresponding to the detection-bonding member 44A of the NAND memory 25F. One end of the conductive line 36L6 is connected to the second portion 35Sb of the pad 35S corresponding to the detection-bonding member 44A of the NAND memory 25F. The other end of the conductive line 36L6 is connected to the ground GND.

Figure 13:
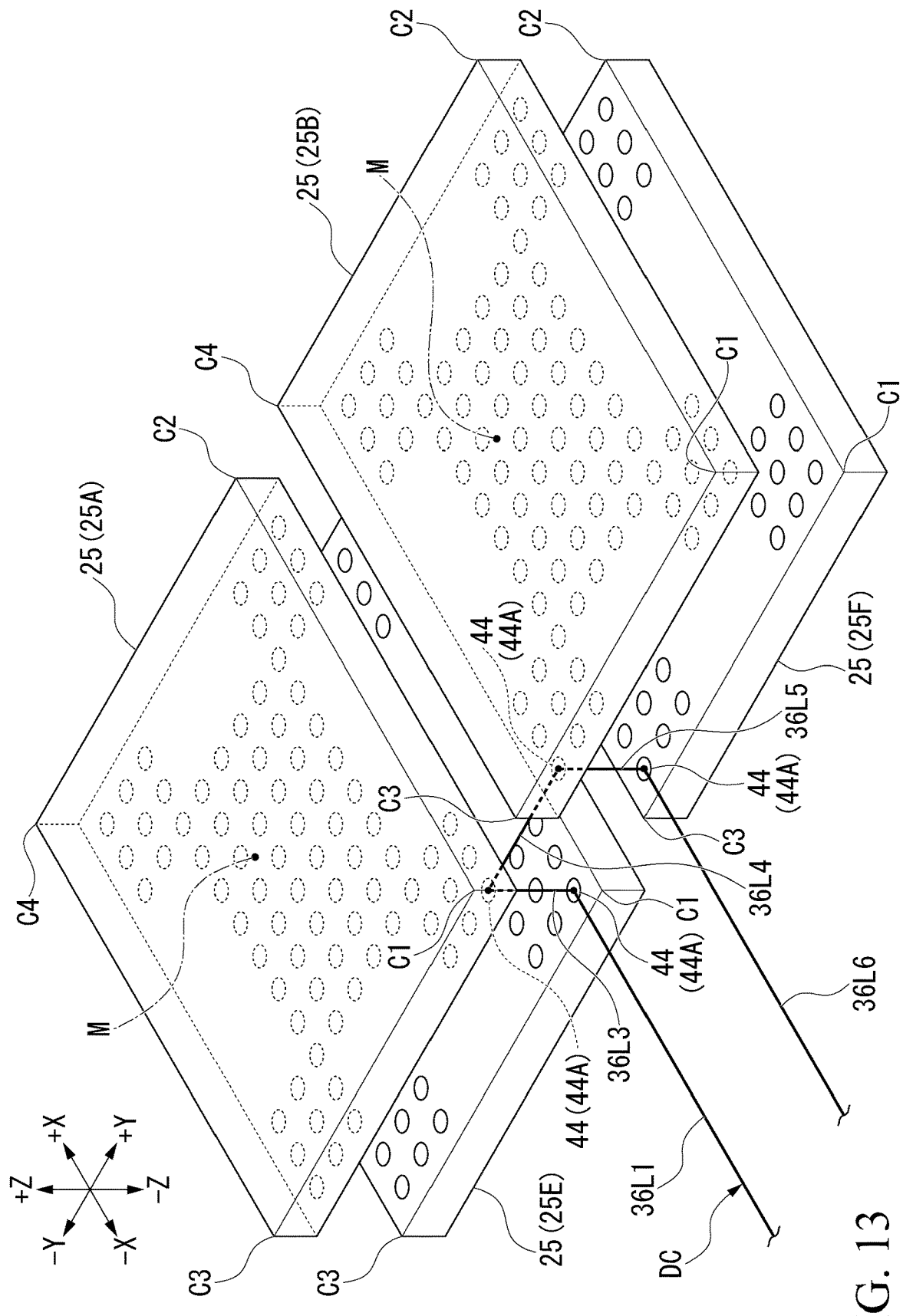
FIG. 13 is a perspective view schematically showing a part of the board unit according to the second embodiment.

FIG. 13 is a perspective view schematically showing a part of the board unit 20 according to the embodiment. Note that, in FIG. 13, for convenience of explanation, the board 21 is not shown and each of the bonding members 44 is formed in a planar shape. In the embodiment, at least a part of the conductive line 36L3 extends in the board 21 in the Z direction between the NAND memory 25A and the NAND memory 25E. For example, at least a part of the conductive line 36L3 is a through hole provided in the board 21. Similarly, at least a part of the conductive line 36L5 extends in the board 21 in the Z direction between the NAND memory 25B and the NAND memory 25F. For example, at least a part of the conductive line 36L5 is a through hole provided in the board 21.

With this configuration, in a case of providing the daisy chain DC in the board unit 20, it is possible to further collect wirings associated with the daisy chain DC in a compact form. Accordingly, the daisy chain DC is further less likely to interfere with a layout regarding wirings for signal transmission or power supply, and it is possible to further increase a degree of ease of drawing the wirings of the NAND memory 25.

Moreover, according to the embodiment, in the case of providing the daisy chain DC in the board unit 20, the above-described effects can be obtained by only changing a design of the board 21. That is, in the case of providing the daisy chain DC in the board unit 20, it is not necessary to change a design of the NAND memory 25, and it is possible to use a general-purpose product as the NAND memory 25. As a result, it is possible to suppress an increase in cost of manufacturing the semiconductor storage device 1.

Modified Example of Second Embodiment

Figure 14:
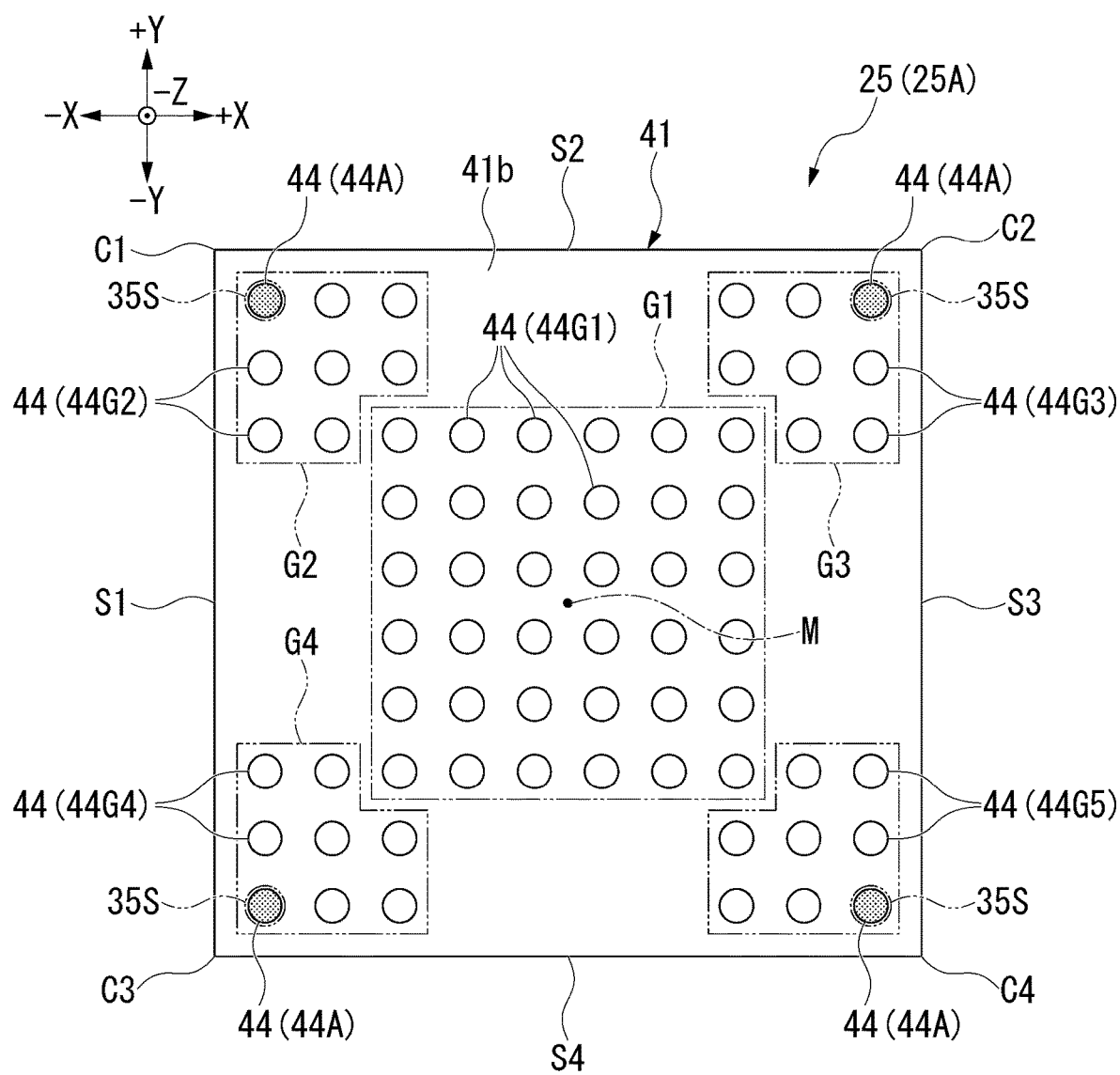
FIG. 14 is a view explaining a configuration of a board unit according to a modified example of the second embodiment.

FIG. 14 is a view explaining a configuration of the board unit 20 according to a modified example of the second embodiment. In the modified example, the detection-bonding members 44A and the pads 35S mentioned above are disposed so as to correspond to each of the four corners C1 to C4. Even with this configuration, in a case of providing the daisy chain DC in the board unit 20, the above-described effects can be obtained by only changing a design of the board 21, and it is possible to suppress an increase in cost of manufacturing the semiconductor storage device 1.

Third Embodiment

Next, a third embodiment will be described. The third embodiment is different from the first embodiment in that the bonding member 44 for used as a power supply terminal is used as the detection-bonding member 44A. Note that, configurations other than those described below are the same as those of the first embodiment.

Figure 15:
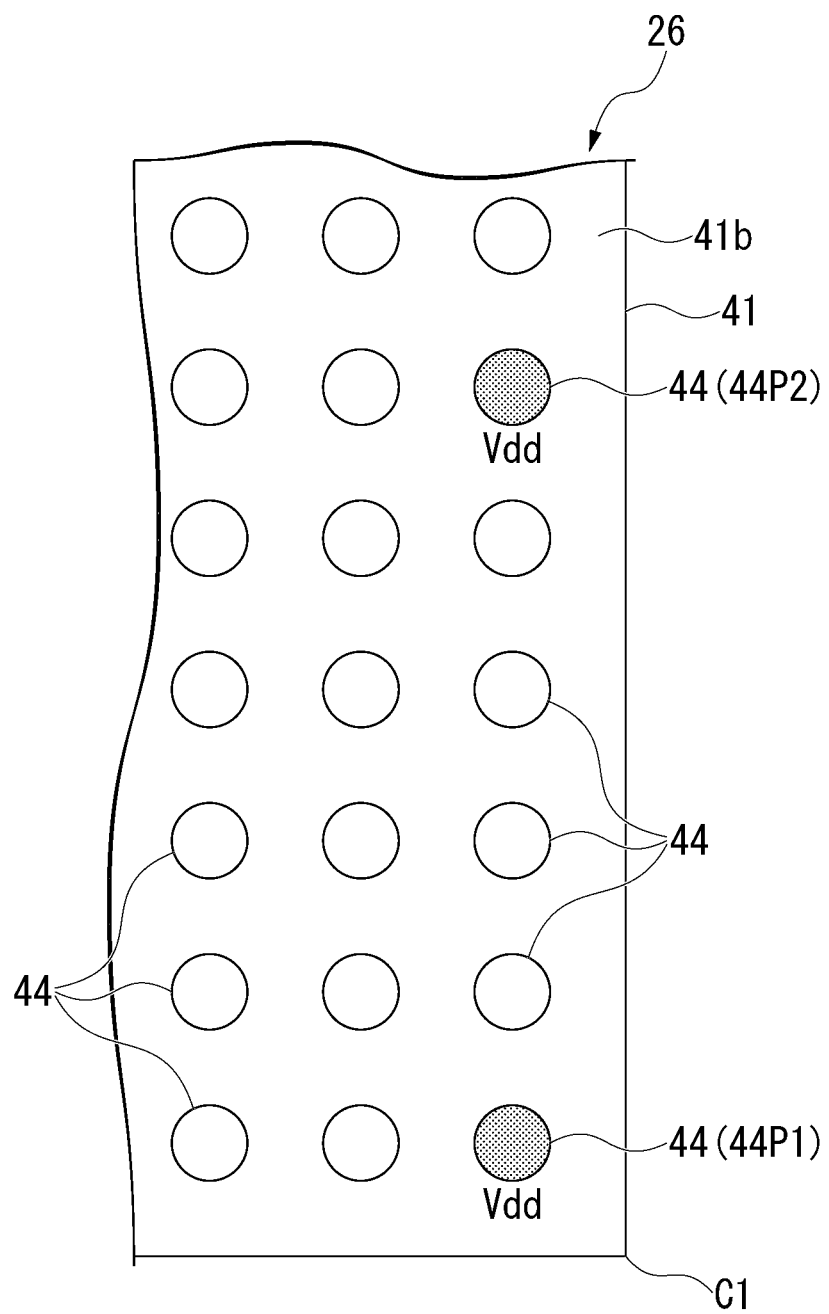
FIG. 15 is a view explaining a configuration of the semiconductor memory according to a third embodiment.

FIG. 15 is a view explaining the DRAM 26 according to the third embodiment. The DRAM 26 includes the plurality of the bonding members 44. The plurality of the bonding members 44 of the DRAM 26 include a first power-source bonding member 44P1 and a second power-source bonding member 44P2. Each of the first power-source bonding member 44P1 and the second power-source bonding member 44P2 is the bonding member 44 for use as a power supply terminal during a normal operation of the semiconductor storage device 1.

The first power-source bonding member 44P1 is the bonding member 44 closest to the optionally selected corner, of the plurality of the bonding members 44 of the DRAM 26. In other words, the first power-source bonding member 44P1 is a so-called corner bump. The first power-source bonding member 44P1 is an example of a "first bonding member". The second power-source bonding member 44P2 is one bonding member 44 of the plurality of the bonding members 44 disposed at an outermost peripheral region of the DRAM 26. The outermost peripheral region is on the DRAM 26. The outermost peripheral region is a region closest to the ends of the DRAM 26 in the X direction or the Y direction. The outermost peripheral region is a region closest to the four sides of the DRAM 26. The outermost peripheral region is an array of the bonding members 44 on the DRAM 26. The second power-source bonding member 44P2 is an example of a "second bonding member". In the embodiment, the DRAM 26 is an example of a "semiconductor memory".

Figure 16:
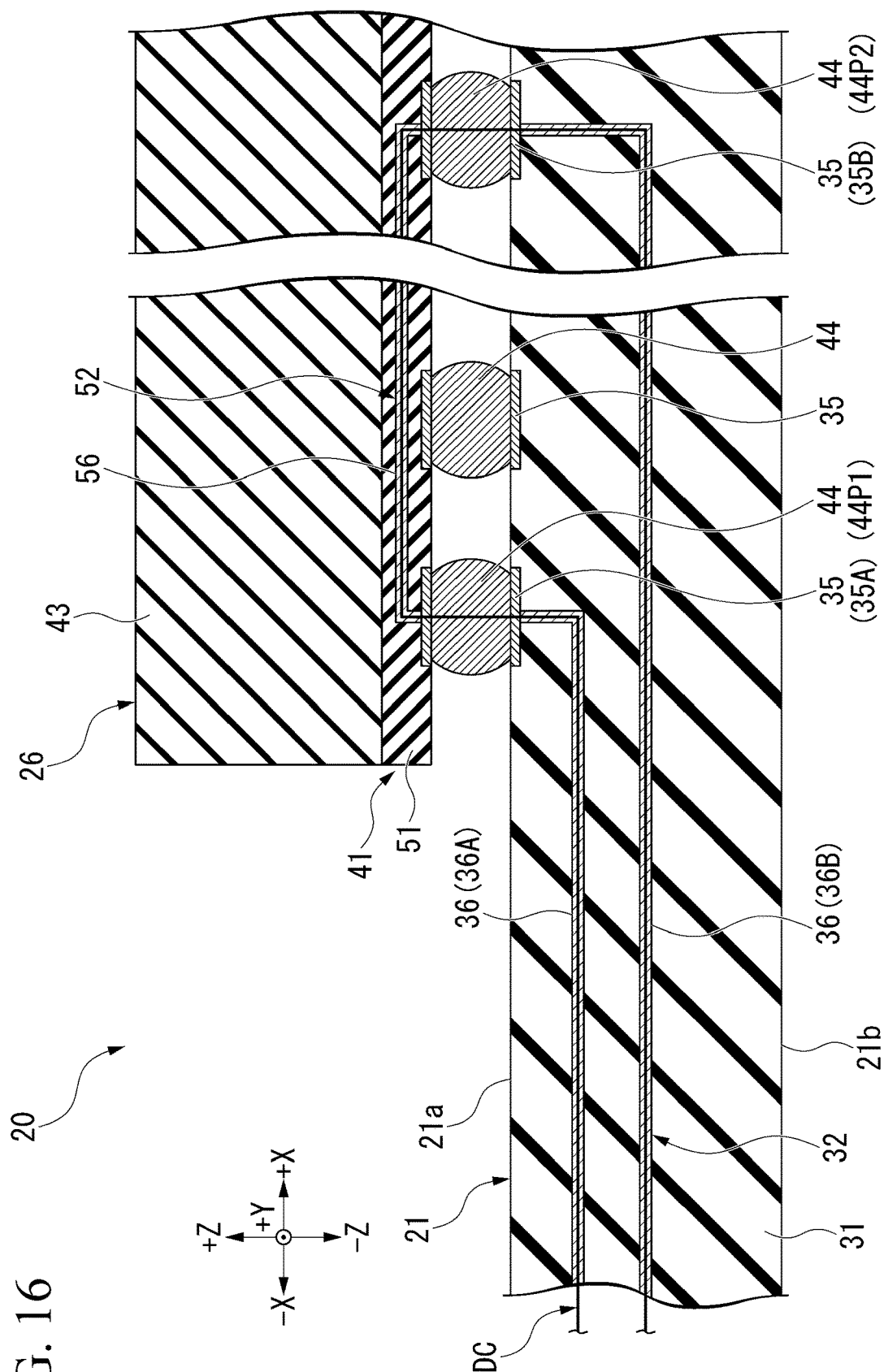
FIG. 16 is a cross-sectional view showing a board unit according to the third embodiment.

FIG. 16 is a cross-sectional view showing the board unit 20 according to the third embodiment. The DRAM 26 includes the package substrate 41 described above. The wiring pattern 52 of the package substrate 41 includes the conductive line 56. The conductive line 56 connects the first power-source bonding member 44P1 and the second power-source bonding member 44P2 in the DRAM 26.

The plurality of the pads 35 provided on the board 21 include the pad 35A and the pad 35B. The first power-source bonding member 44P1 is connected to the pad 35A. The second power-source bonding member 44P2 is connected to the pad 35B. The conductive line 36A is connected to the pad 35A. The conductive line 36B is connected to the pad 35B.

Figure 17:
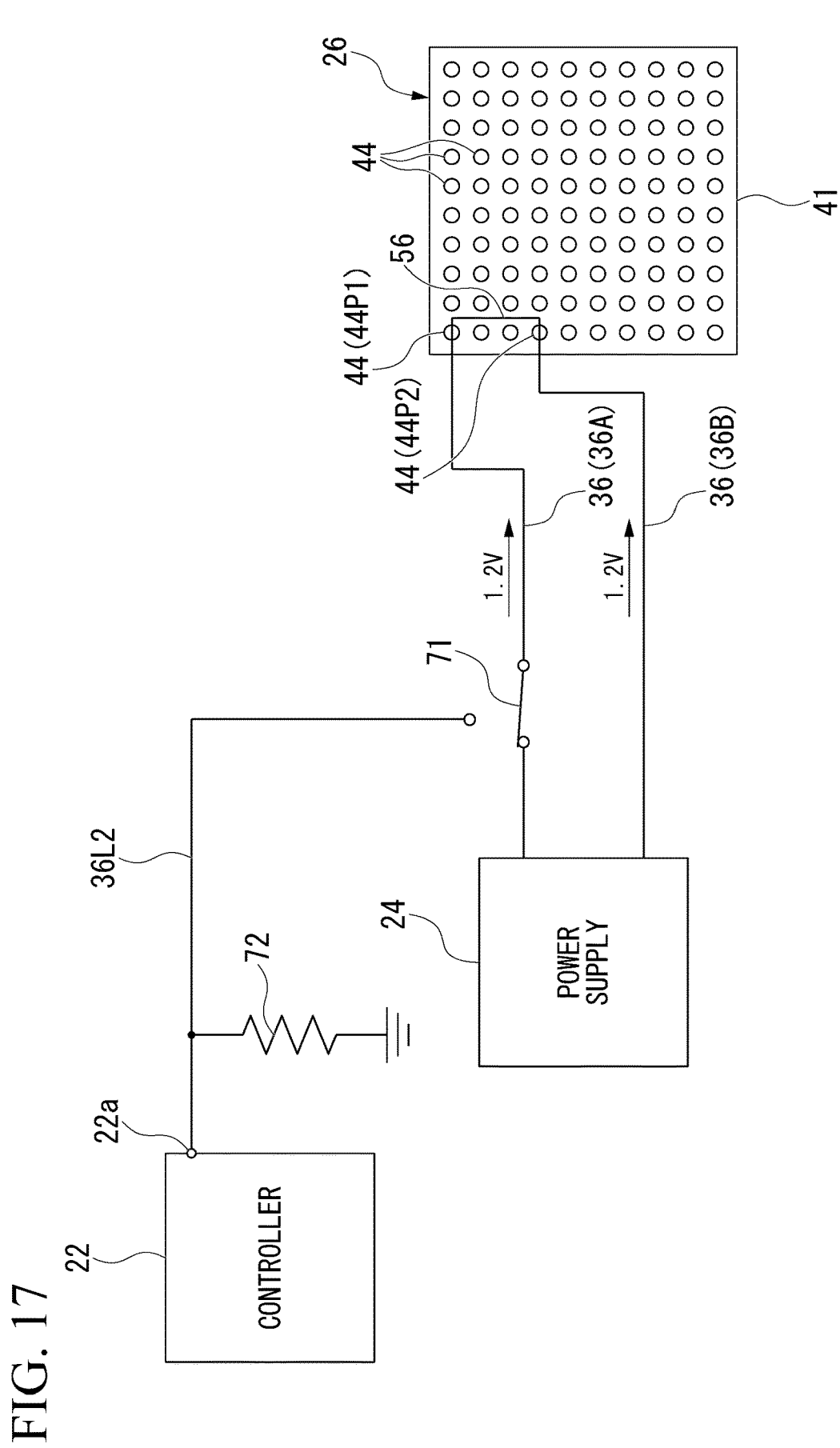
FIG. 17 is a view explaining the board unit according to the third embodiment.

FIG. 17 is a view showing the board unit 20 according to the third embodiment. FIG. 17 shows a use state of the semiconductor storage device 1 during a normal operation. The conductive line 36A is connected to the power supply circuit component 24. A switch 71 is provided between the conductive line 36A and the power supply circuit component 24. During the normal operation, the switch 71 shuts off between the conductive line 36A and the controller 22 and connects the conductive line 36A and the power supply circuit component 24. Because of this, during the normal operation, electric power is supplied to the DRAM 26 from the power supply circuit component 24 via the two conductive lines 36A and 36B.

Figure 18:
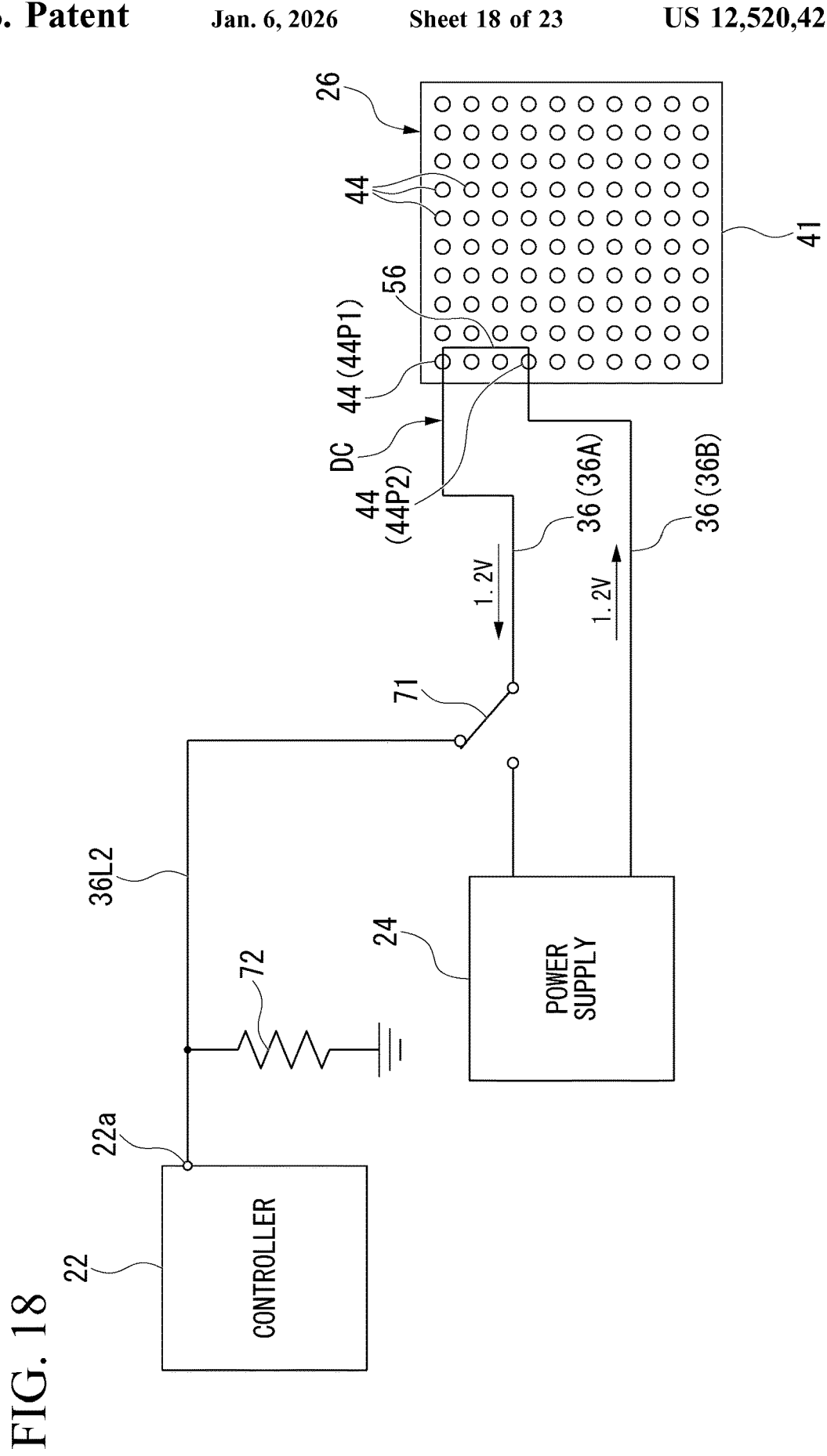
FIG. 18 is a view explaining the board unit according to the third embodiment.

FIG. 18 is a view showing the board unit 20 according to the third embodiment. FIG. 18 shows a use state of the semiconductor storage device 1 during a state detection operation. During the state detection operation, the switch 71 shuts off between the conductive line 36A and the power supply circuit component 24 and connects the conductive line 36A and the conductive line 36L2. Therefore, the conductive line 36A is connected to the input terminal 22a of the controller 22. One end of a resistance element 72 is connected to the middle of the conductive line 36L2. The other end of the resistance element 72 is connected to the ground GND.

During the state detection operation, electric power (for example, a voltage of 1.2V) is supplied to the DRAM 26 from the power supply circuit component 24 via the conductive line 36B, that is, one of the conductive lines. In a case in which there is no defect in a connection state between the board 21 and the DRAM 26, a predetermined voltage (for example, 1.2V) is input to the input terminal 22a of the controller 22. In the case in which a voltage higher than or equal to the predetermined standard is input to the input terminal 22a, the controller 22 determines that the board unit 20 is normal.

On the other hand, in a case in which there is a defect in a connection state between the board 21 and the DRAM 26 (for example, fracture or peeling occurs in the bonding member), a voltage less than the aforementioned predetermined standard is input to the input terminal 22a of the controller 22. In the case in which a voltage less than the aforementioned predetermined standard is input to the input terminal 22a, the controller 22 determines that a defect has occurred in the board unit 20.

With this configuration, the power-source bonding members 44P1 and 44P2 used as power supply terminals can be used as the detection-bonding members 44. Here, the conductive line 56 that connects the two power-source bonding members 44P1 and 44P2 in the DRAM 26 complies with a normal specification of the DRAM 26 (the normal specification corresponds to a standard). Accordingly, in the case of providing the daisy chain DC in the board unit 20, it is not necessary to change a design of the DRAM 26, and it is possible to use a general-purpose product as the DRAM 26. As a result, it is possible to suppress an increase in cost of manufacturing the semiconductor storage device 1.

Fourth Embodiment

Next, a fourth embodiment will be described. The fourth embodiment is different from the first embodiment in that the detection-bonding member 44A is provided near a screw insertion hole 81 of the board 21. Note that, configurations other than those described below are the same as those of the first embodiment.

Figure 19:
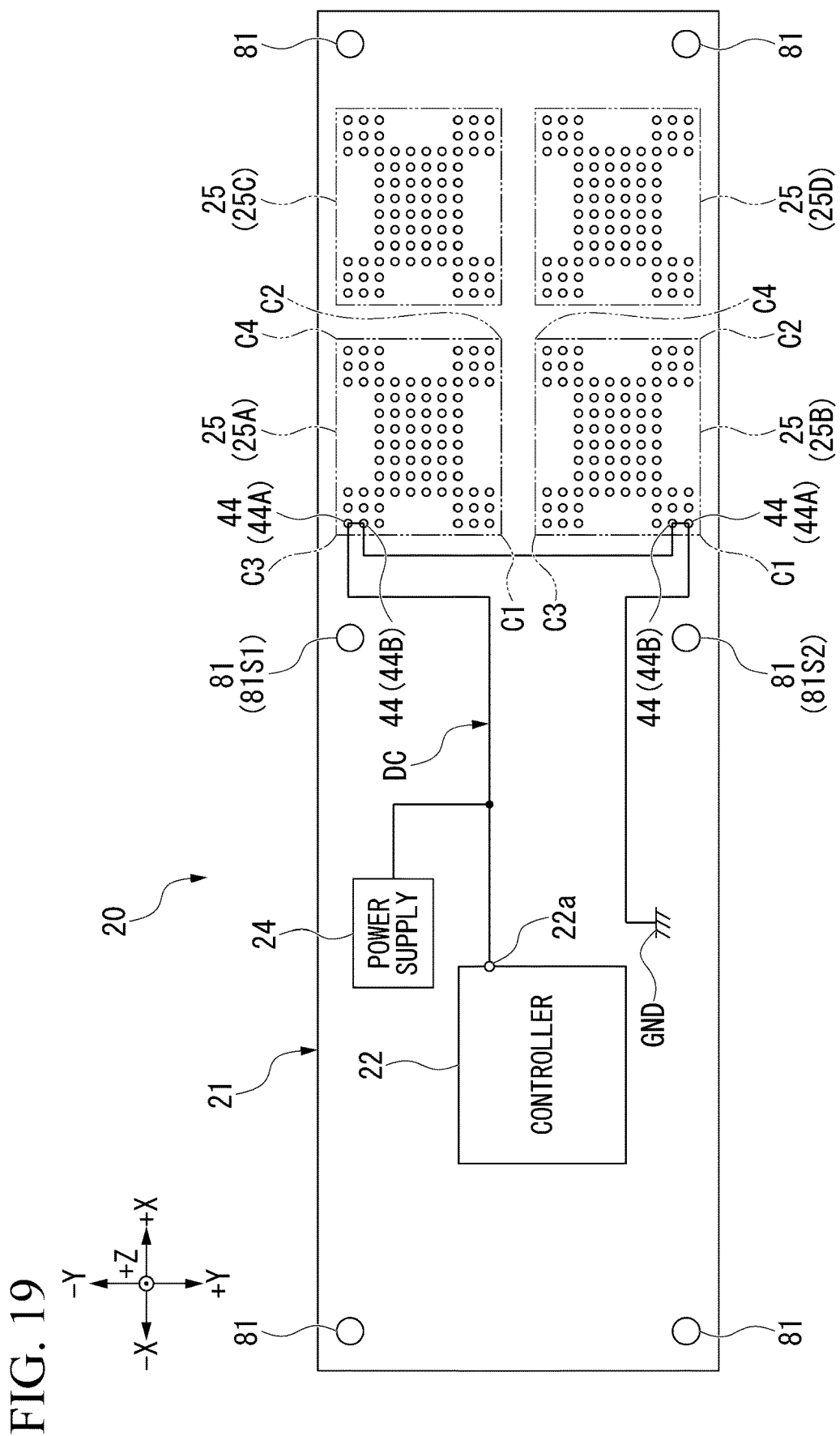
FIG. 19 is a plan view showing a board unit according to the fourth embodiment.

FIG. 19 is a plan view showing the board unit 20 according to the fourth embodiment. The board 21 has a plurality of screw insertion holes 81. Each of the screw insertion holes 81 is, for example, an insertion hole through which the fixing member 13 is inserted. The fixing member 13 is used to fix the board 21 to the housing 10. The plurality of the screw insertion holes 81 include a first screw insertion hole 81S1 and a second screw insertion hole 81S2. Of the plurality of the screw insertion holes 81, each of the first screw insertion hole 81S1 and the second screw insertion hole 81S2 is closest to the NAND memory 25.

Of the plurality of the NAND memories 25, the NAND memory 25A is the NAND memory 25 closest to the first screw insertion hole 81S1. Of the four corners C1 to C4, the NAND memory 25A includes the corner C3 closest to the first screw insertion hole 81S1. Of the four corners of the NAND memory 25A, the corner C3 is, for example, a corner on the side in the −X direction and on the side in the −Y direction. In the embodiment, the plurality of the detection-bonding members 44A and 44B of the NAND memory 25A which are included in the daisy chain DC are disposed so as to correspond to the corner C3.

Similarly, of the plurality of the NAND memories 25, the NAND memory 25B is the NAND memory 25 closest to the second screw insertion hole 81S2. Of the four corners C1 to C4, the NAND memory 25B includes the corner C1 closest to the second screw insertion hole 81S2. Of the four corners of the NAND memory 25B, the corner C1 is, for example, a corner on the side in the −X direction and on the side in the +Y direction. In the embodiment, the plurality of the detection-bonding members 44A and 44B of the NAND memory 25B which are included in the daisy chain DC are disposed so as to correspond to the corner C1.

Here, a defect may be likely to occur at the bonding member 44 of the NAND memory 25B located close to the screw insertion hole 81 as compared to the other bonding members 44. With the aforementioned configuration, it is possible to detect a state of the position near the screw insertion hole 81 on the board unit 20 at which a defect is likely to occur. Consequently, it is possible to increase a degree of accuracy of the state detection.

Fifth Embodiment

Next, a fifth embodiment will be described. The fifth embodiment is different from the first embodiment in that a plurality of detection-bonding members 44D are arranged along an edge 42a of the semiconductor memory chip 42 in the NAND memory 25. Note that, configurations other than those described below are the same as those of the first embodiment.

Figure 20:
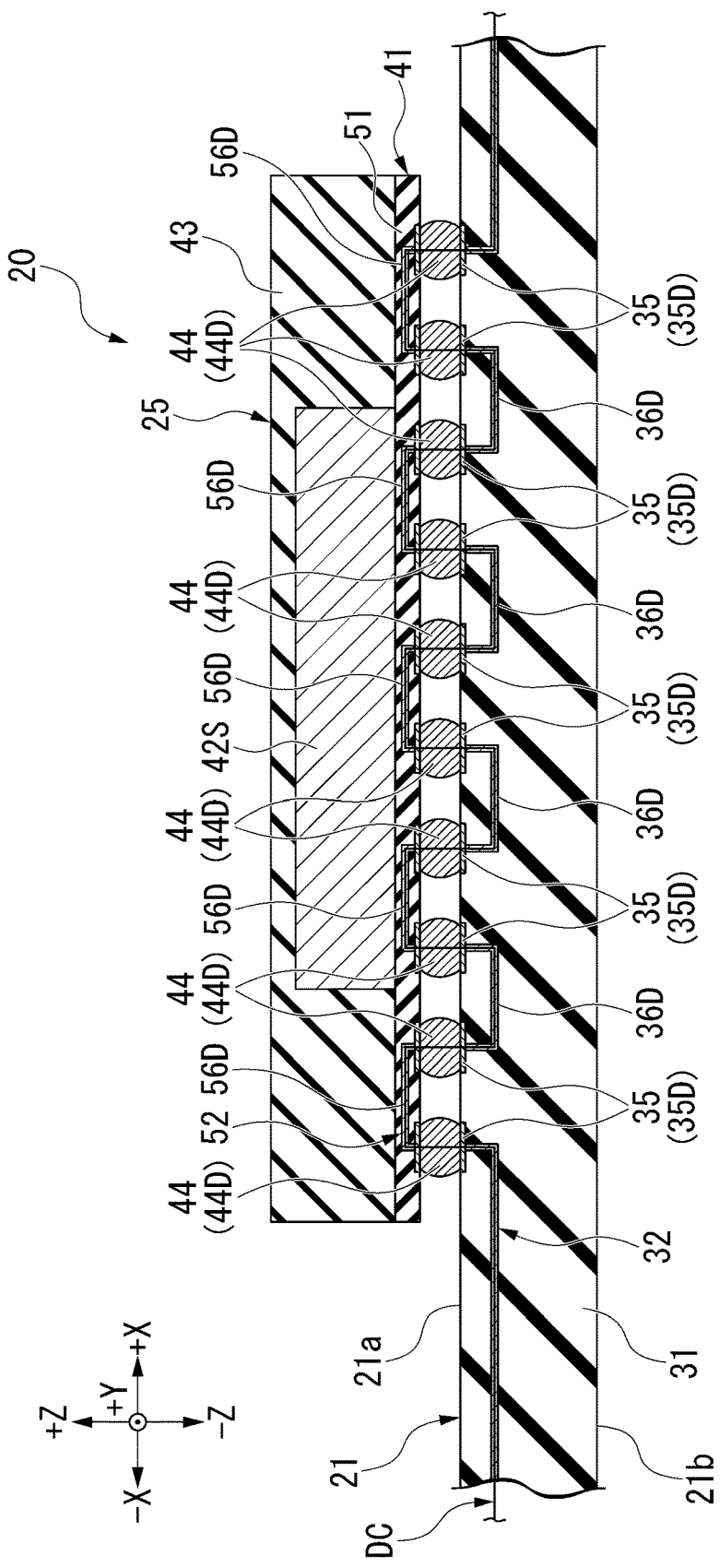
FIG. 20 is a cross-sectional view explaining a daisy chain according to a fifth embodiment.

FIG. 20 is a cross-sectional view explaining the daisy chain DC according to the embodiment. The daisy chain DC includes, for example, a plurality of conductive lines 36D included in the wiring pattern 32 of the board 21, a plurality of pads 35D included in the wiring pattern 32 of the board 21, a plurality of the detection-bonding members 44D included in the plurality of the bonding members 44 of the NAND memory 25, and a plurality of conductive lines 56D included in the wiring pattern 52 of the package substrate 41.

Each of the plurality of the conductive lines 36D connects two pads 35D adjacent to each other. The detection-bonding member 44D of the NAND memory 25 is connected to the pad 35D. Each of the plurality of the conductive lines 56D connects two detection-bonding member 44D adjacent to each other in the NAND memory 25. Accordingly, the plurality of the detection-bonding members 44D are electrically connected in series.

Figure 21:
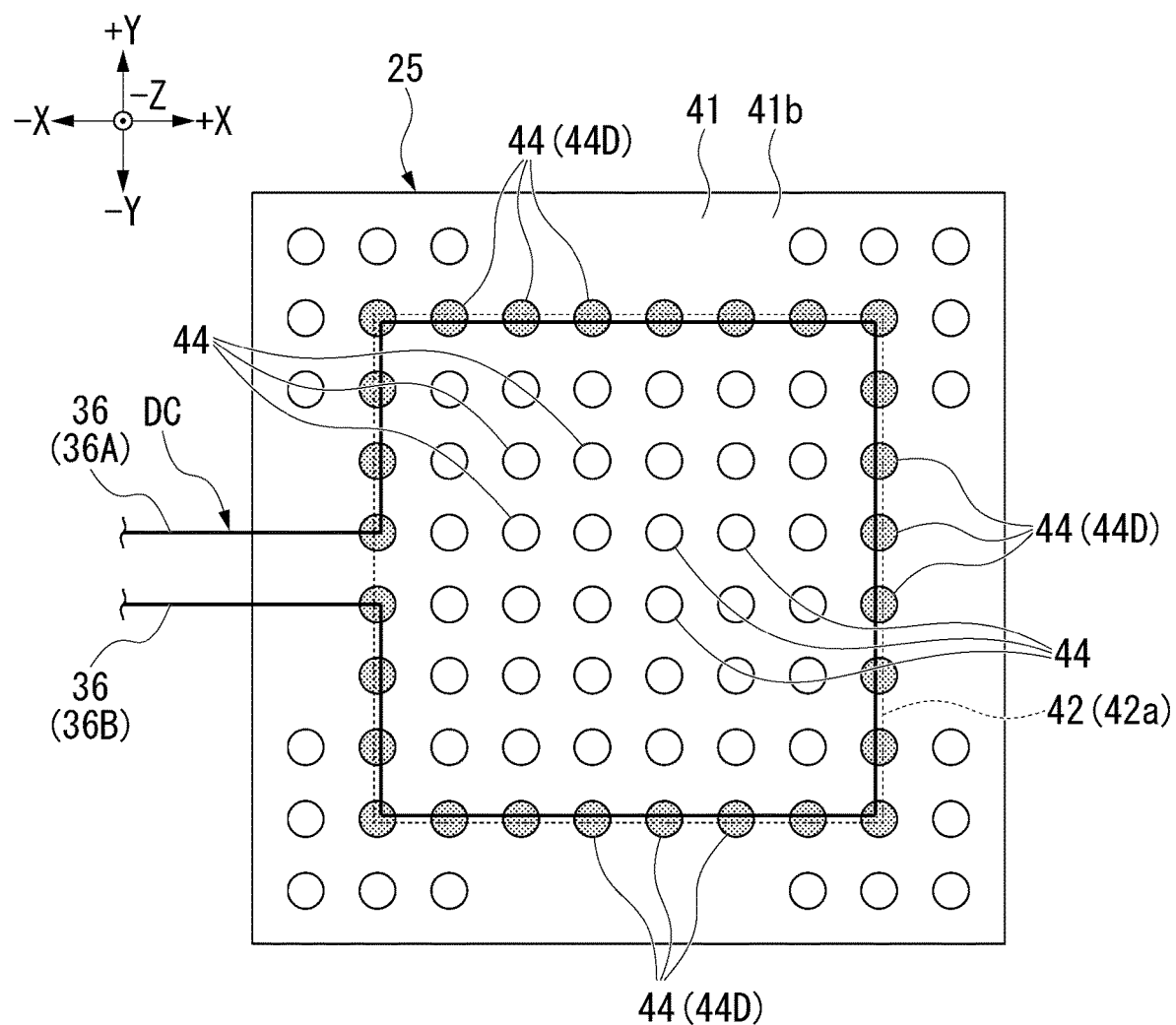
FIG. 21 is a view explaining a configuration of the semiconductor memory according to the fifth embodiment.

FIG. 21 is a view explaining the arrangement of the detection-bonding members 44D. In the embodiment, when viewed from the Z direction, the plurality of the detection-bonding members 44D are arranged along the edge 42a of the semiconductor memory chip 42 (for example, the semiconductor memory chip 42 closest to the package substrate 41).

Here, according to independent research carried out by the inventors, it is apparent that a stress is likely to occur in the bonding member 44 overlapping the edge 42a of the semiconductor memory chip 42 in the Z direction in the NAND memory 25 and that a defect may be likely to occur at the bonding member 44. In consideration of the research results, in the embodiment, the plurality of the detection-bonding members 44D are arranged at the position at which the detection-bonding members 44D overlap the edge 42a of the semiconductor memory chip 42 in the Z direction. With this configuration, it is possible to increase a degree of accuracy of the state detection.

Sixth Embodiment

Next, a sixth embodiment will be described. The sixth embodiment is different from the modified example of the first embodiment in that, of the plurality of the bonding members 44 of the NAND memory 25, three or more bonding members 44 included in the outermost peripheral region are included in the daisy chain DC. Note that, configurations other than those described below are the same as those of the modified example of the first embodiment.

Figure 22:
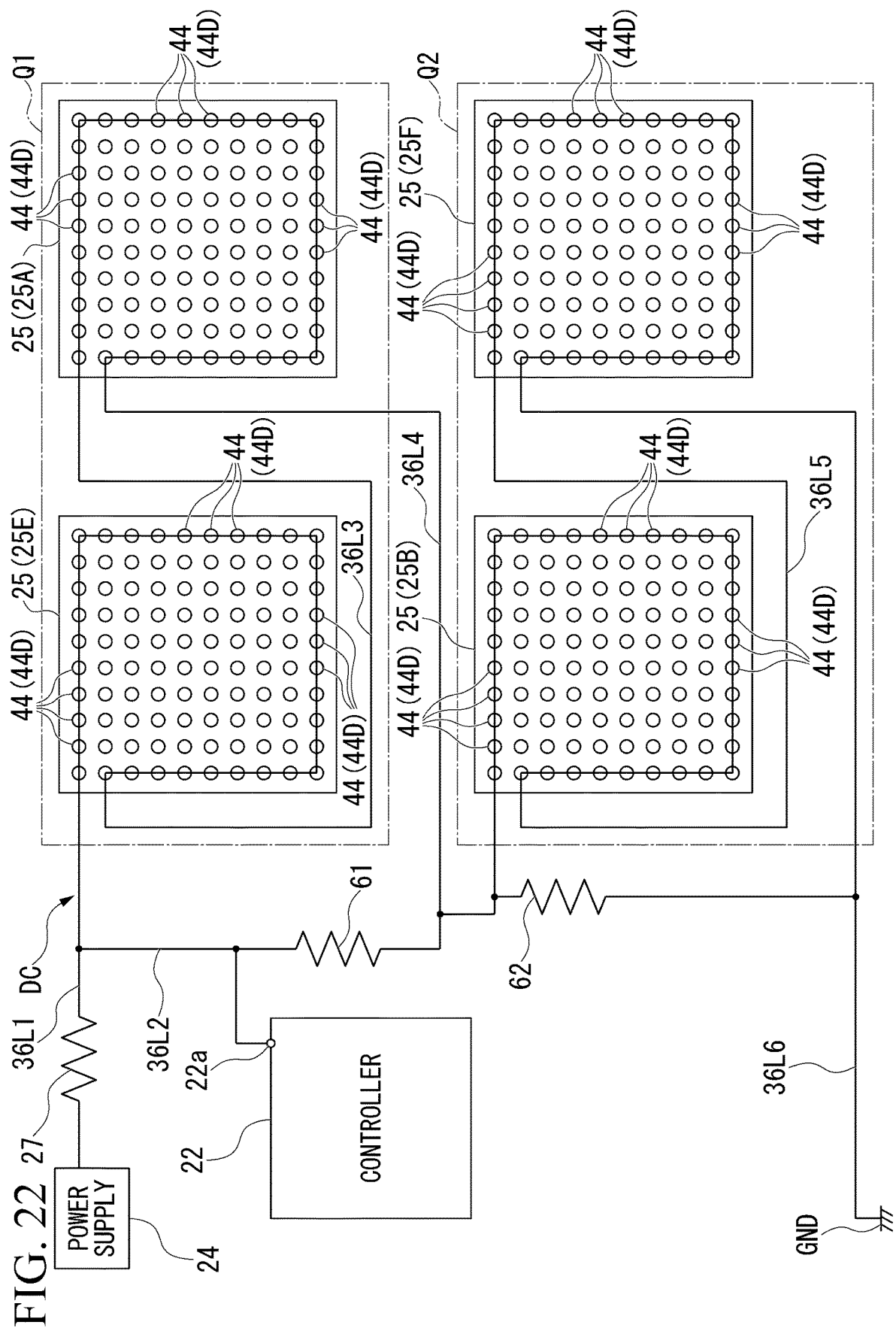
FIG. 22 is a view explaining a configuration of the semiconductor memory according to a sixth embodiment.

FIG. 22 is a view explaining a connection relationship of the daisy chain DC according to the embodiment. The NAND memory 25 includes three or more detection-bonding members 44D included in the outermost peripheral region, of the plurality of the bonding members 44. The three or more detection-bonding members 44D are included in the daisy chain DC. The three or more detection-bonding members 44D are electrically connected in series by, for example, the configuration described in the fifth embodiment.

In the embodiment, the board unit 20 includes the first resistance element 61 and the second resistance element 62. The first resistance element 61 is electrically connected in parallel to the NAND memories 25 (for example, the NAND memories 25A and 25E) included in the first bonding group Q1 on the daisy chain DC.

On the other hand, the second resistance element 62 is electrically connected in parallel to the NAND memories 25 (for example, the NAND memories 25B and 25F) included in the second bonding group Q2 on the daisy chain DC.

With this configuration, in a case in which a defect has occurred in at least one of the NAND memories 25, based on a voltage drop, it is possible to determine whether or not a defect has occurred in the NAND memories 25 included in the first bonding group Q1 and whether or not a defect has occurred in the NAND memories 25 included in the first bonding group Q2. Accordingly, it is possible to further increase a degree of ease of detecting a state of the semiconductor storage device 1.

Seventh Embodiment

Next, a seventh embodiment will be described. The seventh embodiment is different from the modified example of the first embodiment in that a plurality of daisy chains DC (a first daisy chain D1 and a second daisy chain D2) are provided with respect to one NAND memory 25. Note that, configurations other than those described below are the same as those of the modified example of the first embodiment.

Figure 23:
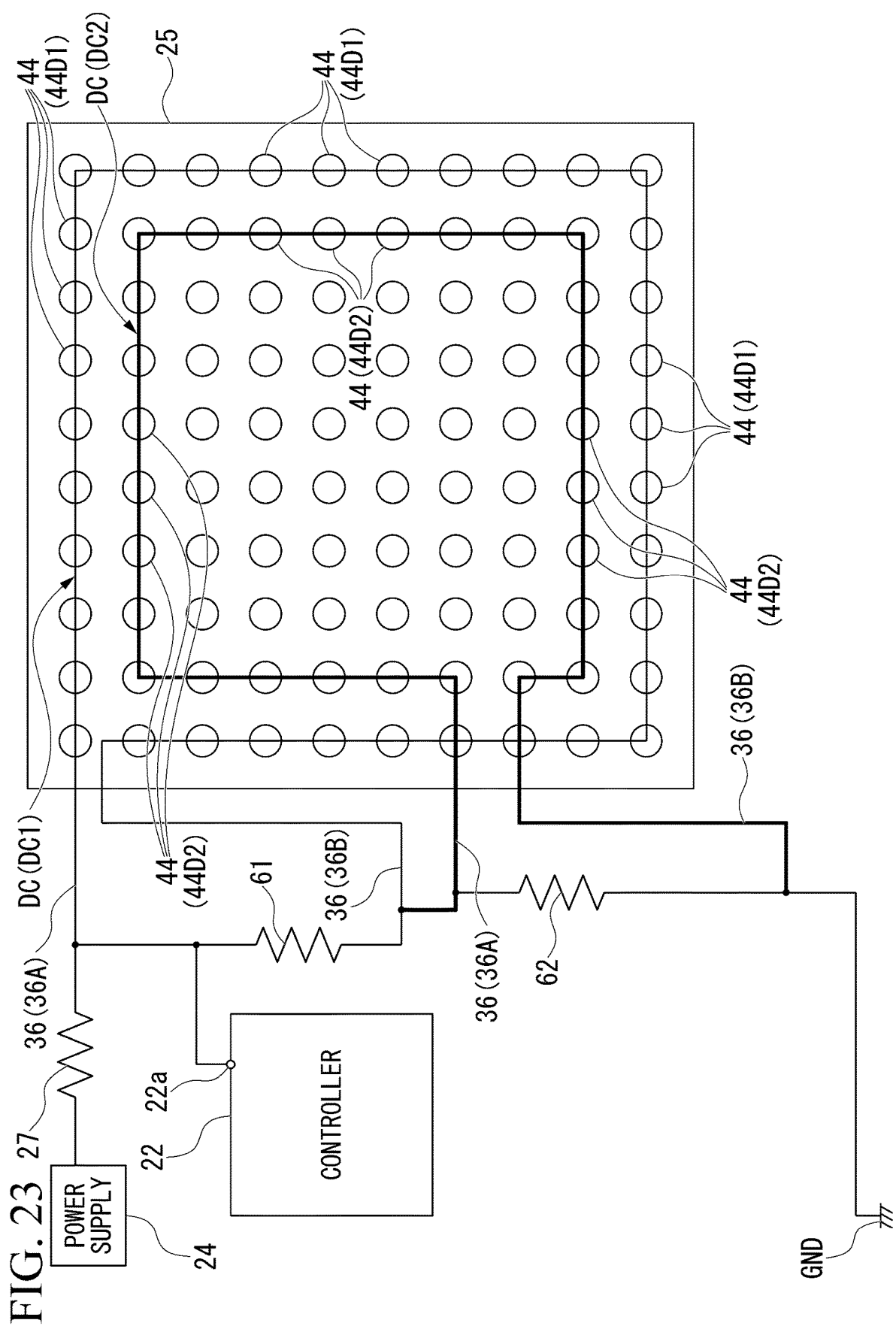
FIG. 23 is a view explaining a configuration of the semiconductor memory according to a seventh embodiment.

FIG. 23 is a view explaining a connection relationship of the daisy chain DC according to the embodiment. The NAND memory 25 includes three or more detection-bonding members 44D1 and three or more detection-bonding members 44D2. Of the plurality of the bonding members 44, the three or more detection-bonding members 44D1 are included in the outermost peripheral region. Of the plurality of the bonding members 44, the three or more detection-bonding members 44D2 are included in an inner peripheral region. The inner peripheral region is on the second surface 41b of the NAND memory 25 located inside the outermost peripheral region by one row of the bonding members 44. The inner peripheral region is an array of the bonding members 44 on the second surface 41b. The above-described three or more detection-bonding members 44D1 are included in the first daisy chain DC1. The above-described three or more detection-bonding members 44D2 are included in the second daisy chain DC2.

The first daisy chain DC1 and the second daisy chain DC2 are electrically connected in series to each other between the power supply circuit component 24 and the ground GND. In the embodiment, the first resistance element 61 is electrically connected in parallel to the first daisy chain DC1. Additionally, the second resistance element 62 is electrically connected in parallel to the second daisy chain DC2.

With this configuration, in a stepwise manner from the outermost peripheral region to the inner peripheral region of the NAND memory 25, it is possible to monitor whether or not a defect has occurred in the bonding member 44. Accordingly, it is possible to increase a degree of ease of detecting a state of the semiconductor storage device 1.

While some embodiments and modified examples have been described above, the embodiments and modified examples are not limited to the above examples. For example, the above-described daisy chain DC is applicable to not only a semiconductor memory but also another semiconductor component such as a CPU (Central Processing Unit). The semiconductor storage device 1 is an example of an "electronic device". The "electronic device" may not include a semiconductor memory.

In the aforementioned second embodiment and subsequent embodiments thereof, the detection-bonding members 44A, 44P1, 44P2, 44D, or the like may not be disposed so as to correspond to one corner of the semiconductor memory. Particularly, the detection-bonding members 44A, 44P1, 44P2, 44D, or the like may be disposed so as to correspond to a plurality of corners of a semiconductor memory or may be disposed at another portion.

According to at least one embodiment described above, the semiconductor storage device includes the board and the first semiconductor memory. The first semiconductor memory includes a plurality of bonding members bonded to the board. The first semiconductor memory has four corners and a center when viewed from a thickness direction of the board. The plurality of the bonding members include one or more first detection-bonding members. The first detection-bonding members are included in a daisy chain. The daisy chain is configured to detect a state associated with the first semiconductor memory. When viewed from the thickness direction, the first detection-bonding members are arranged closer to a first corner of the four corners than the center of the first semiconductor memory. With this configuration, it is possible to increase a degree of ease of inspection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor storage device comprising:
a board;
a first semiconductor memory including a plurality of first bonding members bonded to the board, the first semiconductor memory having a first corner, a second corner, a third corner, and a fourth corner when viewed from a first direction serving as a thickness direction of the board;
a second semiconductor memory including a plurality of second bonding members bonded to the board, the second semiconductor memory having a fifth corner, a sixth corner, a seventh corner, and an eighth corner when viewed from the first direction;
a controller; and
a wiring, wherein
at least one of the plurality of the first bonding members is a first detection-bonding member, the first detection-bonding member is configured to detect a connection state associated with the first semiconductor memory and the second semiconductor memory, at least one of the plurality of the second bonding members is a second detection-bonding member, the second detection-bonding member is electrically connected to the first detection-bonding member, the second detection-bonding member is configured to detect a connection state associated with the first semiconductor memory and the second semiconductor memory, each of the first detection-bonding member and the second detection-bonding member is configured to be electrically connected to the controller, a power supply terminal, and a ground terminal, via the wiring, the power supply terminal is configured to supply a power supply voltage to the semiconductor storage device, the ground terminal is configured to supply ground potential to the semiconductor storage device, the controller is configured to detect a voltage of the wiring, the plurality of the first bonding members include a first group and a second group, the first group includes one part of the plurality of the first bonding members, the second group includes the other part of the plurality of the first bonding members, the second group is at a position closer to the first corner than the first group, the second group includes the first detection-bonding member, the plurality of the second bonding members include a third group and a fourth group, the third group includes one part of the plurality of the second bonding members, the fourth group includes the other part of the plurality of the second bonding members, the fourth group is at a position closer to the fifth corner than the third group, the fourth group includes the second detection-bonding member, the fifth corner is closer to the first corner than the sixth corner, the seventh corner, and the eighth corner, and the first corner is closer to the fifth corner than the second corner, the third corner, and the fourth corner.

2. The semiconductor storage device according to claim 1, wherein the second group is closer to the first corner than the second corner, the third corner, and the fourth corner, and the fourth group is closer to the fifth corner than the sixth corner, the seventh corner, and the eighth corner.

3. The semiconductor storage device according to claim 1, wherein the wiring includes a first conductive line and a second conductive line, the first detection-bonding member is electrically connected between one end of the first conductive line and the second conductive line, and the second detection-bonding member is electrically connected to the other end of the first conductive line.

4. The semiconductor storage device according to claim 3, wherein the board has a first surface side and a second surface side opposite to the first surface side, the first semiconductor memory is at the first surface side, the second semiconductor memory is at the second surface side, and the second semiconductor memory overlaps at least part of the first semiconductor memory when viewed from the first direction.

5. The semiconductor storage device according to claim 3, wherein the board has a first surface side, and the first semiconductor memory and the second semiconductor memory are at the first surface side.

6. The semiconductor storage device according to claim 1, wherein the board has a pad, the first detection-bonding member is connected to the pad, the pad includes a first sub pad and a second sub pad, the second sub pad is at a distance from the first sub pad, one part of the first detection-bonding member is connected to the first sub pad, and the other part of the first detection-bonding member is connected to the second sub pad.

7. The semiconductor storage device according to claim 6, wherein a total of a surface area of the first sub pad and a surface area of the second sub pad is smaller than a projected area of the first detection-bonding member when viewed from the first direction.

8. The semiconductor storage device according to claim 1, further comprising:

a first resistor; and a second resistor having a resistance value different from that of the first resistor, wherein the first resistor is electrically connected in parallel to the first detection-bonding member, and the second resistor is electrically connected in parallel to the second detection-bonding member.

9. A semiconductor storage device comprising:

a board;

a semiconductor memory including a plurality of bonding members bonded to the board, the semiconductor memory having a first corner, a second corner, a third corner, and a fourth corner when viewed from a first direction serving as a thickness direction of the board;

a controller; and a wiring, wherein the plurality of the bonding members include a detection-bonding member configured to detect a connection state associated with the semiconductor memory, the detection-bonding member is configured to be electrically connected to the controller, a power supply terminal, and a ground terminal, via the wiring, the power supply terminal is configured to supply a power supply voltage to the semiconductor storage device, the ground terminal is configured to supply ground potential to the semiconductor storage device, the controller is configured to detect a voltage of the wiring, the plurality of the bonding members include a first group and a second group, the first group includes one part of the plurality of the bonding members, the second group includes the other part of the plurality of the bonding members, the second group is at a position closer to the first corner than the first group, the second group includes the detection-bonding member, the board has a pad, the detection-bonding member is connected to the pad, the pad includes a first sub pad and a second sub pad, the second sub pad is away from the first sub pad, one part of the detection-bonding member is connected to the first sub pad, and the other part of the detection-bonding member is connected to the second sub pad.

10. The semiconductor storage device according to claim 9, wherein
a total of a surface area of the first sub pad and a surface area of the second sub pad is smaller than a projected area of the detection-bonding member when viewed from the first direction.

11. A semiconductor storage device comprising:
a board;
a semiconductor memory including a plurality of bonding members bonded to the board, the semiconductor memory having a first corner, a second corner, a third corner, and a fourth corner when viewed from a first direction serving as a thickness direction of the board;
a controller;
a first wiring; and
a second wiring, wherein
the plurality of the bonding members are closer to the first corner than the second corner, the third corner, and the fourth corner,
the plurality of the bonding members include a first detection-bonding member and a second detection-bonding member,
each of the first detection-bonding member and the second detection-bonding member is configured to detect a connection state of the semiconductor memory,
the first detection-bonding member is configured to be electrically connected to the controller, a power supply terminal, and a ground terminal, via the first wiring,
the power supply terminal is configured to supply a power supply voltage used to operate the semiconductor storage device,
the ground terminal is configured to supply ground potential to the semiconductor storage device,
the second detection-bonding member is configured to be electrically connected to the power supply terminal via the second wiring, and
the controller is configured to detect a voltage of the first wiring in a case in which the first wiring is connected to the controller and the ground terminal.

12. The semiconductor storage device according to claim 11, wherein
the semiconductor memory includes a conductive line, and
the conductive line electrically connects the first detection-bonding member and the second detection-bonding member.

* * * * *